(12) United States Patent
Cho et al.

(10) Patent No.: US 9,847,513 B2
(45) Date of Patent: Dec. 19, 2017

(54) ORGANIC LIGHT EMITTING DISPLAY DEVICE

(71) Applicant: LG DISPLAY CO., LTD., Seoul (KR)

(72) Inventors: Gwijeong Cho, Daegu (KR); ChangWook Han, Seoul (KR); Taeil Kum, Paju-si (KR); Taeshick Kim, Yongin-si (KR); Heedong Choi, Uiwang-si (KR); JiYoung Kim, Seongnam-si (KR); Mingyu Lee, Daegu (KR); TaeSeok Lim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/960,918

(22) Filed: Dec. 7, 2015

(65) Prior Publication Data

US 2016/0164042 A1 Jun. 9, 2016

(30) Foreign Application Priority Data

Dec. 8, 2014 (KR) .................. 10-2014-0175027
Dec. 1, 2015 (KR) .................. 10-2015-0170128

(51) Int. Cl.
*H01L 51/52* (2006.01)
*H01L 27/32* (2006.01)
*H01L 51/50* (2006.01)

(52) U.S. Cl.
CPC ...... *H01L 51/5278* (2013.01); *H01L 27/3206* (2013.01); *H01L 27/3244* (2013.01); *H01L 51/5044* (2013.01); *H01L 2251/558* (2013.01)

(58) Field of Classification Search
CPC ............ H01L 51/5278; H01L 27/3206; H01L 27/3244; H01L 51/5044; H01L 2251/558
See application file for complete search history.

(56) References Cited

U.S. PATENT DOCUMENTS

| | | |
|---|---|---|
| 2006/0040132 A1 | 2/2006 | Liao et al. |
| 2007/0024168 A1 | 2/2007 | Nishimura et al. |
| 2011/0248249 A1* | 10/2011 | Forrest ............... H01L 51/5016 257/40 |
| 2012/0241794 A1 | 9/2012 | Seo et al. |
| 2014/0183496 A1 | 7/2014 | Heo et al. |
| 2014/0183499 A1 | 7/2014 | Kim et al. |

(Continued)

FOREIGN PATENT DOCUMENTS

| | | |
|---|---|---|
| CN | 103531721 A | 1/2014 |
| KR | 10-2012-0076255 A | 7/2012 |

(Continued)

*Primary Examiner* — Fernando L Toledo
*Assistant Examiner* — Neil Prasad
(74) *Attorney, Agent, or Firm* — Birch, Stewart, Kolasch & Birch, LLP

(57) ABSTRACT

Discussed is an organic light emitting display device. The organic light emitting display device according to an embodiment includes a first electrode and a second electrode on a substrate to be opposite to each other and at least three emission parts between the first electrode and the second electrode. A first distance between the substrate and the first emission layer, a second distance between the first emission layer and the second emission layer, a third distance between the second emission layer and the third emission layer, and a fourth distance between the third emission layer and the second electrode are different from each other.

26 Claims, 11 Drawing Sheets

(56) References Cited

U.S. PATENT DOCUMENTS

| | | | | |
|---|---|---|---|---|
| 2015/0188073 A1* | 7/2015 | Ahn | .................... | H01L 27/3209 257/40 |
| 2016/0028037 A1 | 1/2016 | Wu | | |
| 2016/0035991 A1* | 2/2016 | Yamae | ................ | H01L 51/5004 257/40 |
| 2016/0064682 A1 | 3/2016 | Yamae et al. | | |

FOREIGN PATENT DOCUMENTS

| | | |
|---|---|---|
| KR | 10-2014-0086322 A | 7/2014 |
| WO | WO 2012/141107 A1 | 10/2012 |
| WO | WO 2014/185063 A1 | 11/2014 |

\* cited by examiner

ORGANIC LIGHT EMITTING DISPLAY DEVICE

CROSS-REFERENCE TO RELATED APPLICATIONS

This application claims the priority benefit of the Korean Patent Application No. 10-2014-0175027 filed on Dec. 8, 2014, and the Korean Patent Application No. 10-2015-0170128 filed on Dec. 1, 2015, which are all hereby incorporated by reference as if fully set forth herein.

BACKGROUND OF THE INVENTION

Field of the Invention

The present invention relates to an organic light emitting display device, and more particularly, to an organic light emitting display device for improving a color change rate based on a viewing angle.

Discussion of the Related Art

Recently, as society advances to the information-oriented society, the field of display devices which visually express an electrical information signal is rapidly advancing. Flat panel display (FPD) devices, having excellent performance in terms of thinning, lightening, and low power consumption, have been developed.

Examples of the FPD devices include liquid crystal display (LCD) devices, plasma display panel (PDP) devices, field emission display (FED) devices, organic light emitting display devices, etc.

In particular, the organic light emitting display devices are self-emitting devices. In comparison with other FPD devices, the organic light emitting display devices have a fast response time, high emission efficiency, high luminance, and a wide viewing angle.

An organic light emitting device generally includes an organic emission layer which is formed between two electrodes. An electron and a hole are injected from the two electrodes into the organic emission layer, and an exciton is generated by combining the electron with the hole. The organic light emitting device is a device using the principle that light is emitted when the generated exciton is dropped from an excited state to a ground state.

SUMMARY OF THE INVENTION

Organic light emitting display devices realize a full color due to a plurality of sub-pixels respectively emitting red (R) light, green (G) light, and blue (B) light. The plurality of sub-pixels respectively emitting the red (R) light, the green (G) light, and the blue (B) light show color reproduction rates through color coordinates of red, green, and blue.

Since a color reproduction rate is affected by a structure of a device or a material of an organic emission layer configuring an organic light emitting display device, it is difficult to express a desired color. Due to the requirements of consumers desiring good image quality, an effort for enhancing a color coordinate characteristic and a color reproduction rate of an organic light emitting display device is being continuously made.

As one method, there is a method that uses an emission layer as a single layer. The method may manufacture a white organic light emitting device by using a single material or by doping two or more kinds of materials. For example, there is a method where a red dopant and a green dopant are applied to a blue host, or a red dopant, a green dopant, and a blue dopant are added to a host material having high bandgap energy. However, it is incomplete to transfer energy to a dopant, and it is difficult to adjust a balance of white.

Moreover, a component of a dopant in a corresponding emission layer is limited due to a characteristic of a dopant itself. Also, mixing of emission layers focuses on realizing white light, and thus, a wavelength characteristic is shown in a wavelength instead of red, green, and blue. Therefore, emission efficiencies of red, green, and blue are reduced due to an undesired wavelength value.

In another method, a structure may be provided where white light is emitted by stacking two emission layers having a complementary color relationship. However, in the structure, a difference between a peak wavelength range of each emission layer and a transmissive area of a color filter occurs when white light passes through the color filter. For this reason, a color range capable of expression is narrowed, and consequently, it is difficult to realize a desired color reproduction rate or a color coordinate characteristic.

Therefore, the inventors recognize the above-described problems and limitations, and have invented an organic light emitting display device having a new structure for improving efficiency and a color reproduction rate or a color viewing angle change rate.

Accordingly, the present invention is directed to provide an organic light emitting display device that substantially obviates one or more problems due to limitations and disadvantages of the related art.

An aspect of the present invention is directed to provide an organic light emitting display device in which the thicknesses of organic layers configuring emission parts are optimized, and thus, a color change rate based on a viewing angle is reduced, thereby improving efficiency and a color reproduction rate or a color change rate.

The objects of the present invention are not limited to the aforesaid, but other objects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device which includes a first electrode on a substrate, a first emission part on the first electrode and including a first emission layer, a second emission part on the first emission part and including a second emission layer, a third emission part on the second emission part and including a third emission layer, and a second electrode on the third emission part, wherein a first distance between the substrate and the first emission layer, a second distance between the first emission layer and the second emission layer, a third distance between the second emission layer and the third emission layer, and a fourth distance between the third emission layer and the second electrode are different from each other.

The first distance may be larger than the second distance or the third distance.

The second distance may be smaller than the third distance.

The fourth distance may be smaller than the third distance.

The first distance may include a thickness of at least one first organic layer between the substrate and the first emission layer and a thickness of the first electrode, and the first distance may be within a range from approximately 165 nm to 240 nm.

The second distance may include a thickness of at least one second organic layer between the first emission layer and the second emission layer, and the second distance may be within a range from approximately 25 nm to 50 nm.

The third distance may include a thickness of at least one third organic layer between the second emission layer and the third emission layer, and the third distance may be within a range from approximately 114 nm to 150 nm.

The fourth distance may include a thickness of at least one fourth organic layer between the third emission layer and the second electrode, and the fourth distance may be within a range of approximately 35 nm or less.

A distance from a bottom surface of the second electrode to a top surface of the substrate may be within a range from approximately 334 nm to 580 nm.

A sum of a thickness of the first emission layer, a thickness of the second emission layer, and a thickness of the third emission layer may be within a range from approximately 30 nm to 140 nm.

The first distance, the second distance, the third distance, and the fourth distance may be adjusted to reduce a color change rate based on a viewing angle, based on a peak wavelength difference and an emission intensity change rate based on a viewing angle of each of the first to third emission layers.

The first emission layer and the third emission layer may each include one of a blue emission layer, a sky blue emission layer, and a deep blue emission layer, and the second emission layer may include one of a yellow-green emission layer and a green emission layer.

The peak wavelength difference based on a viewing angle of each of the first emission layer and the third emission layer may be 8 nm or less, and the peak wavelength difference based on a viewing angle of the second emission layer may be approximately 12 nm or less.

The emission intensity change rate based on a viewing angle of each of the first emission layer and the third emission layer may be within (a±15)%, with a % being an emission intensity change rate based on a viewing angle of the second emission layer.

Color change rates at viewing angles of 0 degrees to 60 degrees may be approximately 0.020 or less.

In another aspect of the present invention, there is provided an organic light emitting display device which includes a first electrode and a second electrode on a substrate to be opposite to each other and at least three emission parts between the first electrode and the second electrode, the at least three emission parts each including at least one organic layer, wherein the at least three emission parts include a first emission part a first emission layer, a second emission part including a second emission layer, and a third emission part including a third emission layer, and include an adjusted thickness of organic layers (ATOL) structure so that a thickness of the at least one organic layer is adjusted to reduce a color change rate based on a viewing angle, based on a peak wavelength difference and an emission intensity change rate based on a viewing angle.

The first emission layer and the third emission layer may each include one of a blue emission layer, a sky blue emission layer, and a deep blue emission layer, and the second emission layer may include one of a yellow-green emission layer and a green emission layer.

The ATOL structure may be configured such that the peak wavelength difference based on a viewing angle of each of the first emission layer and the third emission layer is approximately 8 nm or less, and the peak wavelength difference based on a viewing angle of the second emission layer is approximately 12 nm or less.

The ATOL structure is configured such that the emission intensity change rate based on a viewing angle of each of the first emission layer and the third emission layer is within (a±15)%, with a % being an emission intensity change rate based on a viewing angle of the second emission layer.

The ATOL structure is configured such that color change rates at viewing angles of 0 degrees to 60 degrees are approximately 0.020 or less.

The organic light emitting display device may further include at least one first organic layer between the substrate and the first emission layer, wherein a sum of a thickness of the at least one first organic layer and a thickness of the first electrode is within a range from approximately 165 nm to 240 nm.

The organic light emitting display device may further include at least one second organic layer between the first emission layer and the second emission layer, wherein a thickness of the at least one second organic layer is within a range from approximately 25 nm to 50 nm.

The organic light emitting display device may further include at least one third organic layer between the second emission layer and the third emission layer, wherein a thickness of the at least one third organic layer is within a range from approximately 114 nm to 150 nm.

The organic light emitting display device may further include at least one fourth organic layer between the third emission layer and the second electrode, wherein a thickness of the at least one fourth organic layer is within a range of approximately 35 nm or less.

A thickness from a bottom surface of the second electrode to a top surface of the substrate may be within a range from approximately 334 nm to 580 nm.

A sum of a thickness of the first emission layer, a thickness of the second emission layer, and a thickness of the third emission layer may be within a range from approximately 30 nm to 140 nm.

Details of the embodiments of the present invention are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
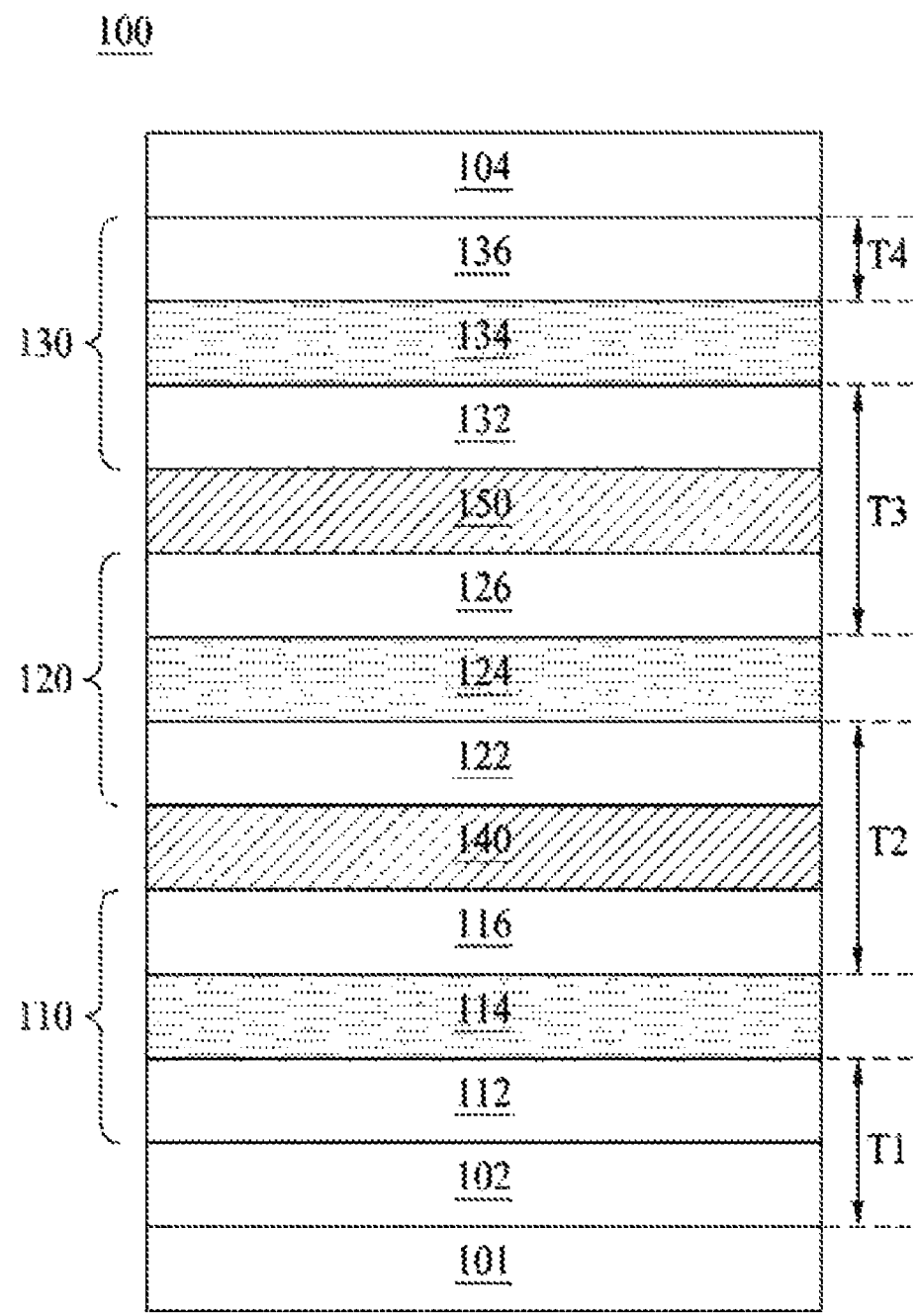
FIG. 1 is a cross-sectional view illustrating an organic light emitting device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a cross-sectional view illustrating an organic light emitting device 100 according to an embodiment of the present invention. All the components of the organic light emitting device in all the embodiments of the present invention are operatively coupled and configured.

The organic light emitting device 100 illustrated in FIG. 1 may include first and second electrodes 102 and 104 and first to third emission parts 110, 120 and 130 between the first and second electrodes 102 and 104, which are on a substrate 101. A first thickness T1 may refer to a distance between the substrate 101 and a first emission layer 114 of the first emission part 110, i.e. between an upper surface of the substrate 101 and a lower surface of the first emission layer 114. Likewise, a second thickness T2 may refer to a distance between the first emission layer 114 of the first emission part 110 and a second emission layer 124 of the second emission part 120, and a third thickness T3 may refer to a distance between the second emission layer 124 of the second emission part 120 and a third emission layer 134 of the third emission part 130, and a fourth thickness T4 may refer to a distance between the third emission layer 134 of the third emission part 130 and the second electrode 104.

The substrate 101 may be formed of glass, metal, or plastic.

The first electrode 102 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 104 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 102 and the second electrode 104 may be referred to as an anode or a cathode. Also, the first electrode 102 may be referred to as a semi-transmissive electrode, and the second electrode 104 may be referred to as a reflective electrode.

Here, a bottom emission type where the first electrode 102 is the semi-transmissive electrode and the second electrode 104 is the reflective electrode will be described.

The first emission part 110 may include a first hole transport layer (HTL) 112, a first emission layer (EML) 114, and a first electron transport layer (ETL) 116 which are on the first electrode 102.

The first EML 114 may be a blue emission layer. The second emission part 120 may be on the first emission part 110 and may include a second HTL 122, a second EML 124, and a second ETL 126. The second EML 124 may be a yellow-green emission layer.

A first charge generation layer (CGL) 140 may be further formed between the first emission part 110 and the second emission part 120. The first CGL 140 may adjust a balance of electrical charges between the first emission part 110 and the second emission part 120. The first CGL 140 may include a first N-type CGL and a first P-type CGL.

The third emission part 130 may be on the second emission part 120 and may include a third HTL 132, a third EML 134, and a third ETL 136. The third EML 134 may be a blue emission layer.

A second CGL 150 may be further formed between the second emission part 120 and the third emission part 130. The second CGL 150 may adjust a balance of electrical charges between the second emission part 120 and the third emission part 130. The second CGL 150 may include a second N-type CGL and a second P-type CGL.

In an embodiment of the present invention, one emission part may be further provided in addition to two emission parts including a blue emission layer and a yellow-green emission layer, thereby implementing three emission parts. That is, a blue emission layer may be further provided in the one emission part, thereby enhancing an efficiency of the blue emission layer. However, the inventors have recognized that when an organic light emitting display device is manufactured and implemented with the organic light emitting device according to an embodiment of the present invention, blue efficiency is enhanced by further providing the blue emission layer, but a color of a screen of the organic light emitting display device is changed to a bluish color.

Therefore, the inventors have experimented on the above-described problems. A result of the experiment will be described below in detail with reference to FIGS. 2 and 3.

Here, an electroluminescence (EL) peak of the organic light emitting display device may be determined by a multiplication of a photoluminescence (PL) peak, at which an emission layer displays a unique color thereof, and emittance (EM) peaks of organic layers configuring an organic light emitting device. A maximum wavelength of an EL peak of the organic light emitting display device may be referred to as a peak wavelength "$\lambda$max".

Figure 2:
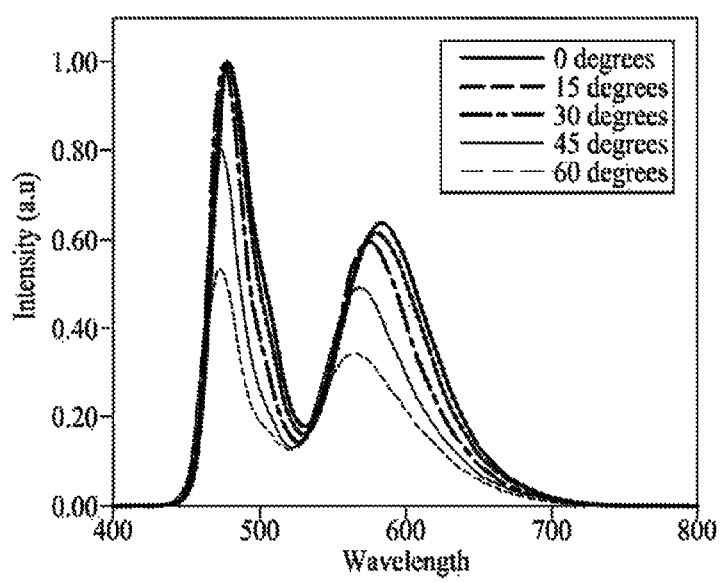
FIG. 2 is a diagram showing an electroluminescence (EL) spectrum according to an embodiment of the present invention.

FIG. 2 is a diagram showing an EL spectrum according to an embodiment of the present invention. FIG. 2 shows results which are obtained by measuring an EL spectrum at 0 degrees, 15 degrees, 30 degrees, 45 degrees, and 60 degrees when seen from the front of an organic light emitting display device. Also, the abscissa axis indicates a wavelength range (nm) of light, and the ordinate axis indicates emission intensity (a.u., arbitrary unit). The emission intensity is a numerical value which is expressed as a relative value with respect to a maximum value of an EL spectrum. That is, an emission intensity of blue corresponding to 0 degrees may be 1, and emission intensity may be expressed by converting emission intensity based on a wavelength range of light at various viewing angles.

A peak wavelength "$\lambda$max" corresponding to a blue area may be within a range of 440 nm to 480 nm, and a peak wavelength "$\lambda$max" corresponding to a yellow-green area may be within a range of 540 nm to 580 nm. Also, it can be seen that as a viewing angle is changed from 0 degrees to 60 degrees, an emission intensity change rate of blue rapidly increases in comparison with an emission intensity change rate of yellow-green. Therefore, it is difficult to adjust an emission intensity change rate of blue and an emission intensity change rate of yellow-green depending on a viewing angle, and thus, it is difficult to realize desired color coordinates of white. For this reason, a color defect where a screen of an organic light emitting display device is shown in a bluish color occurs.

Figure 3:
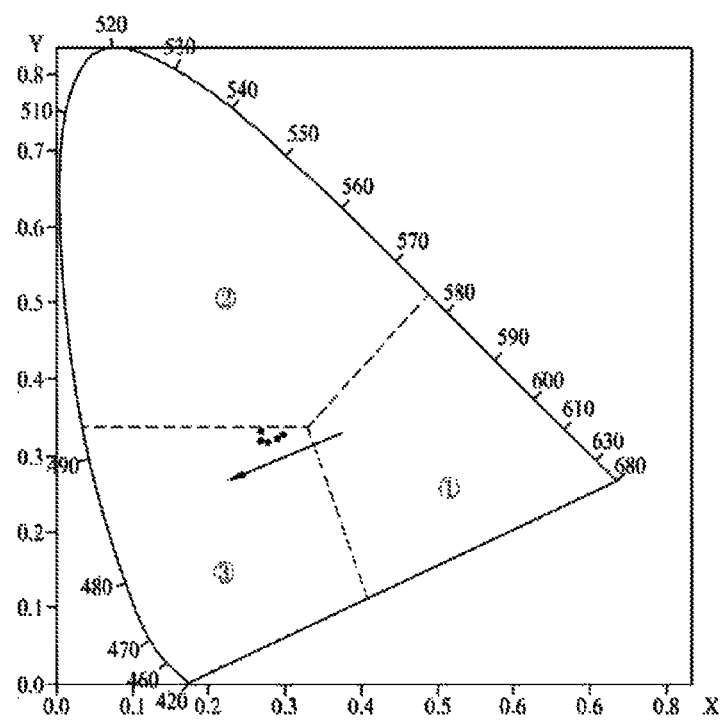
FIG. 3 is a diagram showing a color change rate with respect to a viewing angle in an embodiment of the present invention.

FIG. 3 is a diagram showing a color change rate with respect to a viewing angle in an embodiment of the present invention. Particularly, FIG. 3 is a diagram showing a change in color coordinates when a viewing angle is changed from 0 degrees to 60 degrees. In FIG. 3, color coordinates corresponding to 0 degrees, 15 degrees, 30 degrees, 45 degrees, and 60 degrees are illustrated as a connection line that connects the color coordinates, and color coordinates moved by 0 degrees, 15 degrees, 30 degrees, 45 degrees, and 60 degrees are illustrated as an arrow. Also, an area $\hat{1}$ indicates a red-series color on color coordinates, an area $\hat{2}$ indicates a green-series color on the color coordinates, and an area $\hat{3}$ indicates a blue-series color on the color coordinates.

As shown in FIG. 3, it can be seen that color coordinates correspond to white at 0 degrees, the color coordinates are changed to blue-series color of the area $\hat{3}$ up to 30 degrees, and the color coordinates are changed to green-series color of area $\hat{2}$ from 45 degrees to 60 degrees. For this reason, a color defect where a color change of an organic light emitting display device caused by a viewing angle is shown by eyes occurs.

Therefore, the inventors have done various experiments for reducing a change in color coordinates caused by a viewing angle to improve a color change of an organic light emitting display device depending on viewing angles at which a screen of the organic light emitting display device is seen.

As described above, an EL peak of the organic light emitting display device may be determined by a multiplication of a PL peak, at which an emission layer displays a unique color thereof, and EM peaks of organic layers configuring an organic light emitting device. A PL peak may be affected by characteristics of dopants in emission layers, namely, the unique characteristics and content of the dopants. EM peaks of the organic layers may be affected by thicknesses and optical characteristics of organic layers. Accordingly, the thicknesses of organic layers constituting the emission parts affects the EM peak of the organic layers, and the PL peak and the EM peaks of the organic layers may affect the EL peak of the organic light emitting display device.

Moreover, it is important to set positions of the emission layers configuring the emission parts for enhancing an efficiency of the organic light emitting device. The positions of the emission layers may be set after a total thickness of all layers (hereinafter referred to as a total thickness) between a substrate and a second electrode is first set. The total thickness may be set as a thickness which enables maximum efficiency to be obtained within a range corresponding to a wavelength range of each of dopants in the emission layers. Therefore, setting positions of the emission layers denotes that the thicknesses of organic layers configuring the emission parts are set. Therefore, an efficiency of the organic light emitting device is enhanced, but as described above, the inventors have recognized that it is difficult to realize desired color coordinates because peak wavelengths or emission intensity change rates of the emission layers are changed depending on a viewing angle. Thus, the inventors have recognized that color coordinates or a color change rate based on a viewing angle is affected by the thicknesses of the organic layers configuring the emission parts and is changed depending on the thicknesses of the organic layers. Also, the inventors have recognized that when a color change rate "Δu'v'" from 0 degrees to 60 degrees is greater than 0.020, a color defect occurs due to a color change caused by a viewing angle.

Therefore, the inventors have done experiments for testing whether the thicknesses of organic layers affect a change in color coordinates caused by a viewing angle. That is, the inventors have done experiments for whether the thicknesses of the organic layers affect a peak wavelength difference based on a viewing angle and an emission intensity change rate based on a viewing angle, and thus affect a change in color coordinates caused by a viewing angle.

This will be described with reference to FIGS. 4A to 12. FIGS. 4A to 12 show measurement results which are obtained by measuring an organic light emitting display device including the organic light emitting device of FIG. 1.

FIGS. 4A to 6 show results which are obtained by adjusting a third thickness T3 of FIG. 1 to measure an EL spectrum, color coordinates, and a color change rate when a viewing angle is changed from 0 degrees to 60 degrees depending on the third thickness T3 in a state where a first thickness T1, a second thickness T2, and a fourth thickness T4 illustrated in FIG. 1 are fixed.

In FIGS. 4A to 6, the third thickness T3 may correspond to a thickness of at least one layer between the second EML 124 and the third EML 134. For example, the at least one layer may include a second ETL 126, a second CGL 150, and a third HTL 132. A thickness of at least one layer in the third thickness T3 does not limit details of the present invention, and other layers configuring the third thickness T3 may be further provided depending on a structure or characteristic of an organic light emitting device. For example, at least one of a hole injection layer (HIL), an electron injection layer (EIL), a hole blocking layer (HBL), and an electron blocking layer (EBL) which are between the second EML 124 and the third EML 134 may be further provided. In this case, the third thickness T3 may further include a thickness of an added layer.

Moreover, in an embodiment 1 shown in FIGS. 4A to 6, measurement has been performed in a state where the fourth thickness T4 is 25 nm, the third thickness T3 is 150 nm, the second thickness T2 is 42 nm, and the first thickness T1 is 240 nm. The first thickness T1, the second thickness T2, the third thickness T3, and the fourth thickness T4 may be values which are set for the experiment. In a comparative example 1, the third thickness T3 may be formed 10 nm thicker than 150 nm which is the third thickness T3 of the embodiment 1. In a comparative example 2, the third thickness T3 may be 165 nm which is 15 nm thicker than 150 nm.

Figure 4A:
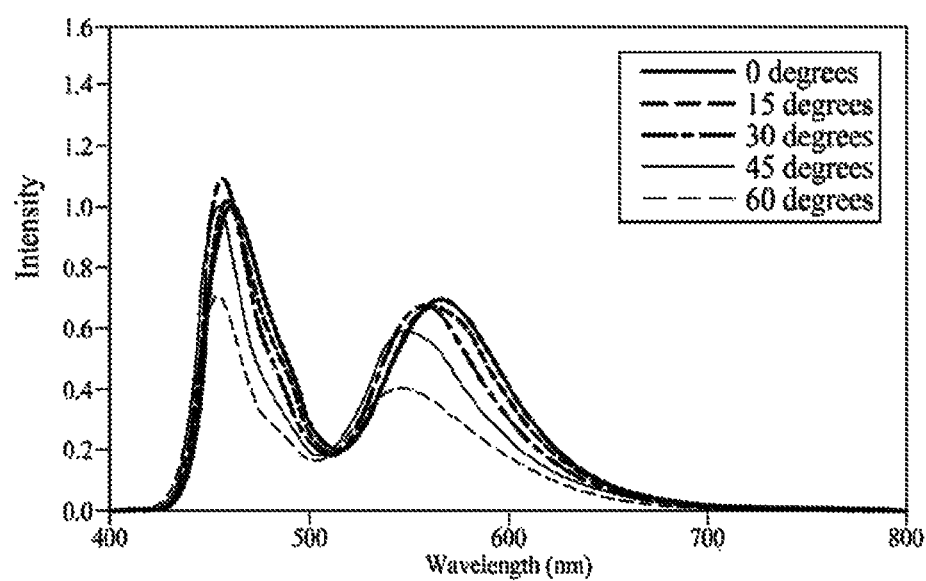
FIGS. 4A to 4C are diagrams showing EL spectrums based on a third thickness in an embodiment 1 of the present invention, a comparative example 1, and a comparative example 2, respectively.
Figure 4B:
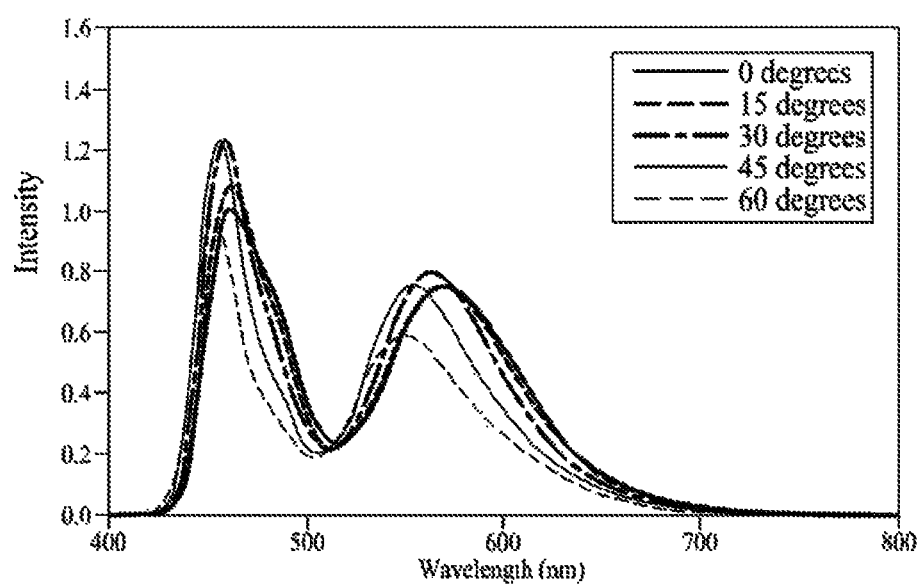
Figure 4C:
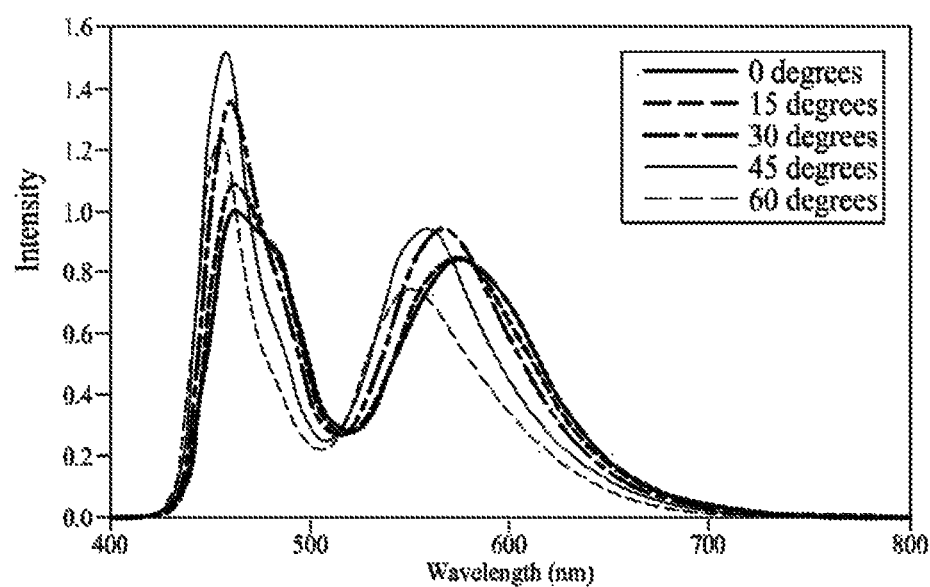

FIGS. 4A to 4C are diagrams showing EL spectrums based on a third thickness in an embodiment 1 of the present invention, a comparative example 1, and a comparative example 2, respectively.

FIGS. 4A to 4C show results which are obtained by measuring an EL spectrum at 0 degrees, 15 degrees, 30 degrees, 45 degrees, and 60 degrees when seen from the front of an organic light emitting display device. Also, in FIGS. 4A to 4C, the abscissa axis indicates a wavelength range (nm) of light, and the ordinate axis indicates emission intensity (a.u., arbitrary unit). An emission intensity of blue corresponding to 0 degrees may be 1, and emission intensity may be expressed by converting emission intensity based on a wavelength range of light at various viewing angles. Here, the EL spectrum has been measured at 0 degrees, 15 degrees, 30 degrees, 45 degrees, and 60 degrees, but an angle at which the organic light emitting display device is seen may be changed depending on users. However, the angles for measurement do not limit details of the present invention.

FIG. 4A shows an EL spectrum of the embodiment 1 of the present invention depending on a viewing angle, FIG. 4B shows an EL spectrum of the comparative example 1 depending on a viewing angle, and FIG. 4C shows an EL spectrum of the comparative example 2 depending on a viewing angle. In FIGS. 4A to 4C, a first peak wavelength "λmax" may be a peak wavelength corresponding to a blue area of a blue emission layer which is each of the first EML and the third EML illustrated in FIG. 1, and may be within a range of 440 nm to 480 nm. Also, a second peak wavelength "λmax" may be a peak wavelength corresponding to a yellow-green area of a yellow-green emission layer which is the second EML illustrated in FIG. 1, and may be within a range of 540 nm to 580 nm.

As shown in FIG. 4A, a first peak wavelength "λmax" of the embodiment 1 of the present invention has been measured as 460 nm at 0 degrees and measured as 452 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the embodiment 1 of the present invention has been measured as 564 nm at 0 degrees and measured as 548 nm at 60 degrees, and thus, it can be seen that a difference between the second peak wavelength "λmax" corresponding to 0 degrees and the second peak wavelength "λmax" corresponding to 60 degrees is 16 nm. To describe an emission intensity change rate of the embodiment 1, an emission intensity of blue may be 1.000 a.u. at 0 degrees and may be 0.704 a.u. at 60 degrees, and thus, it can be seen that the emission intensity change rate is 70.4%. Also, an emission intensity of yellow-green may be 0.690 a.u. at 0 degrees and may be 0.405 a.u. at 60 degrees, and thus, it can be seen that the emission intensity change rate is 58.7%. An emission intensity change rate denotes a ratio of emission intensity corresponding to 60 degrees to emission intensity corresponding to 0 degrees.

As shown in FIG. 4B, a first peak wavelength "λmax" of the comparative example 1 has been measured as 464 nm at 0 degrees and measured as 456 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the comparative example 1 has been measured as 572 nm at 0 degrees and measured as 552 nm at 60 degrees, and thus, it can be seen that a difference between the second peak wavelength "λmax" corresponding to 0 degrees and the second peak wavelength "λmax" corresponding to 60 degrees is 20 nm. To describe an emission intensity change rate of the comparative example 1, an emission intensity of blue may be 1.000 a.u. at 0 degrees and may be 0.969 a.u. at 60 degrees, and thus, it can be seen that the emission intensity change rate is 96.9%. Also, an emission intensity of yellow-green may be 0.751 a.u. at 0 degrees and may be 0.589 a.u. at 60 degrees, and thus, it can be seen that the emission intensity change rate is 78.4%.

As shown in FIG. 4C, a first peak wavelength "λmax" of the comparative example 2 has been measured as 464 nm at 0 degrees and measured as 456 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the comparative example 2 has been measured as 576 nm at 0 degrees and measured as 552 nm at 60 degrees, and thus, it can be seen that a difference between the second peak wavelength "λmax" corresponding to 0 degrees and the second peak wavelength "λmax" corresponding to 60 degrees is 24 nm. To describe an emission intensity change rate of the comparative example 2, an emission intensity of blue may be 1.000 a.u. at 0 degrees and may be 1.230 a.u. at 60 degrees, and thus, it can be seen that the emission intensity change rate is 123.0%. Also, an emission intensity of yellow-green may be 0.837 a.u. at 0 degrees and may be 0.744 a.u. at 60 degrees, and thus, it can be seen that the emission intensity change rate is 88.8%.

Color coordinates and a color change rate based on the third thickness T3 in FIGS. 4A to 4C will be described in detail with reference to FIGS. 5 and 6.

Figure 5:
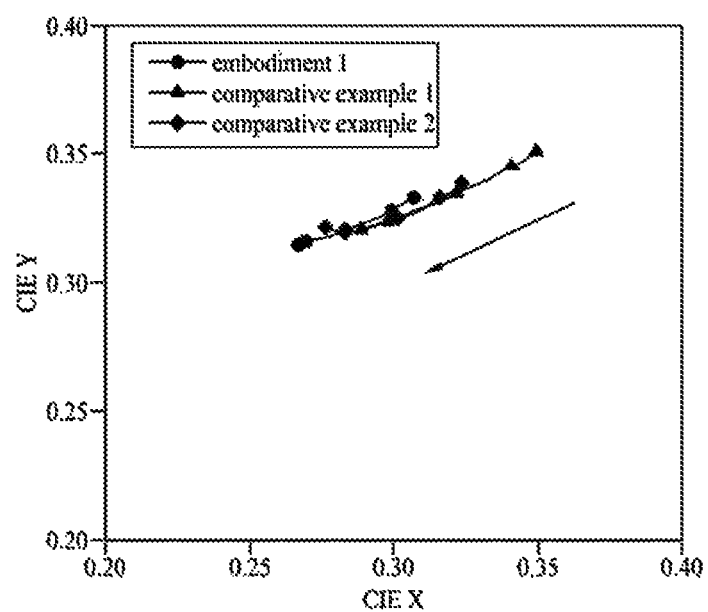
FIG. 5 is a diagram showing color coordinates with respect to viewing angles in the embodiment 1 of the present invention, the comparative example 1, and the comparative example 2.

FIG. 5 is a diagram showing color coordinates with respect to viewing angles in the embodiment 1 of the present invention, the comparative example 1, and the comparative example 2. In FIG. 5, color coordinates corresponding to 0 degrees, 15 degrees, 30 degrees, 45 degrees, and 60 degrees are illustrated as a connection line that connects the color coordinates, and color coordinates moved by 0 degrees, 15 degrees, 30 degrees, 45 degrees, and 60 degrees are illustrated as an arrow. The angles for measurement do not limit details of the present invention. The color coordinates have been measured from CIE 1931 color coordinates.

As the connection line illustrated in FIG. 5 becomes shorter, a change in color coordinates caused by a viewing angle is small. That is, in comparison with the comparative example 1 and the comparative example 2, it can be seen that in the embodiment 1 of the present invention, a change in color coordinates caused by a viewing angle is small.

Figure 6:
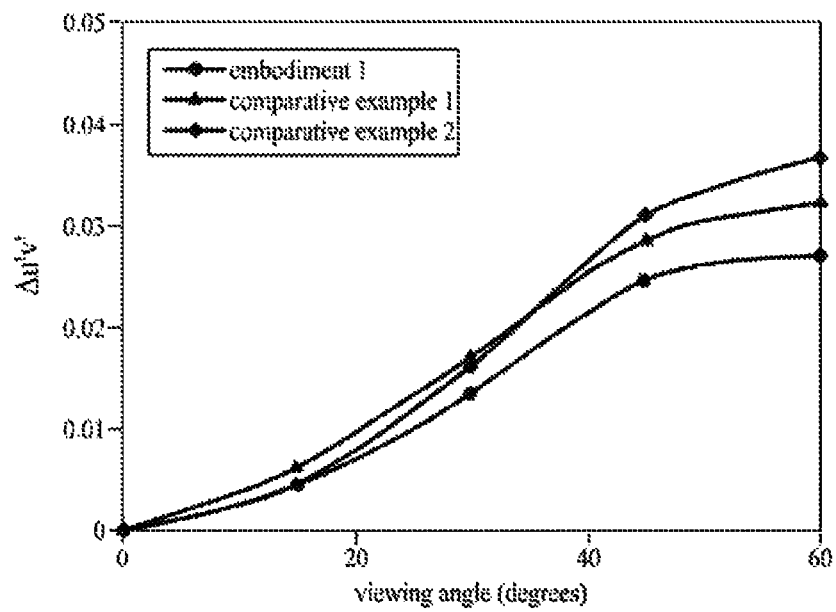
FIG. 6 is a diagram showing color change rates with respect to viewing angles in the embodiment 1 of the present invention, the comparative example 1, and the comparative example 2.

FIG. 6 is a diagram showing color change rates "Δu'v'" with respect to viewing angles in the embodiment 1 of the present invention, the comparative example 1, and the comparative example 2. In FIG. 6, the abscissa axis indicates a viewing angle, and the ordinate axis indicates a color change rate "Δu'v'".

FIG. 6 shows results which are obtained by measuring a color change rate "Δu'v'" at 0 degrees, 15 degrees, 30 degrees, 45 degrees, and 60 degrees when seen from the front of an organic light emitting display device. The color change rate "Δu'v'" may be measured at a maximally diagonal angle which enables a screen to be normally seen from the front of the organic light emitting display device. Here, the maximally diagonal angle may be equal to or larger than 60 degrees and smaller than 90 degrees. Also, the color change rate "Δu'v'" has been measured based on CIE 1976 UCS diagram (u' v' coordinate system). In CIE xy color space used since 1931, research for complementing a difference between a visual color difference and a numerical color difference has been done, and CIE uv color space was adopted as standard in 1960. Also, CIE u'v' color space was adopted as standard in 1976 through additional research. CIE u'v' is obtained by setting u'=u, and v'=3/2v in CIE uv to change the rate.

To describe a color change rate "Δu'v'" based on a viewing angle, as shown in FIG. 6, it can be seen that the color change rate "Δu'v'" of the embodiment 1 is 0.027 at 60 degrees, the color change rate "Δu'v'" of the comparative example 1 is 0.032 at 60 degrees, and the color change rate "Δu'v'" of the comparative example 2 is 0.037 at 60 degrees. It can be seen that the color change rate "Δu'v'" at 60 degrees of the embodiment 1 is small in comparison with the comparative example 1 and the comparative example 2. Also, it can be seen that in the embodiment 1, the comparative example 1, and the comparative example 2, the color change rates "Δu'v'" at 45 degrees and 60 degrees are greater than 0.020.

As described above with reference to FIGS. 4A to 6, it can be seen that as the third thickness T3 increases, the third thickness T3 affects a peak wavelength difference of blue based on a viewing angle, a peak wavelength difference of yellow-green based on a viewing angle, an emission intensity change rate of blue based on a viewing angle, and an emission intensity change rate of yellow-green based on a viewing angle.

FIGS. 7A to 9 show results which are obtained by adjusting the second thickness T2 of FIG. 1 to measure an EL spectrum, color coordinates, and a color change rate when a viewing angle is changed from 0 degrees to 60 degrees depending on the second thickness T2 in a state where the first thickness T1, the third thickness T3, and the fourth thickness T4 illustrated in FIG. 1 are not changed.

In FIGS. 7A to 9, the second thickness T2 may correspond to a thickness of at least one layer between the first EML 114 and the second EML 124. For example, the at least one layer may include a first ETL 116, a first CGL 140, and a second HTL 122. A thickness of at least one layer in the second thickness T2 does not limit details of the present invention, and other layers configuring the second thickness T2 may be further provided depending on a structure or characteristic of an organic light emitting device. For example, at least one of an HIL, an EIL, an HBL, and an EBL which are between the first EML 114 and the second EML 124 may be further provided. In this case, the second thickness T2 may further include a thickness of an added layer.

Moreover, in an embodiment 2 shown in FIGS. 7A to 9, measurement has been performed in a state where the fourth thickness T4 is 25 nm, the third thickness T3 is 135 nm, the second thickness T2 is 50 nm, and the first thickness T1 is 240 nm. The first thickness T1, the second thickness T2, the third thickness T3, and the fourth thickness T4 may be values which are set for the experiment. In a comparative example 3, the second thickness T2 may be 52 nm which is 2 nm thicker than 50 nm which is the second thickness T2 of the embodiment 2 of the present invention.

Figure 7A:
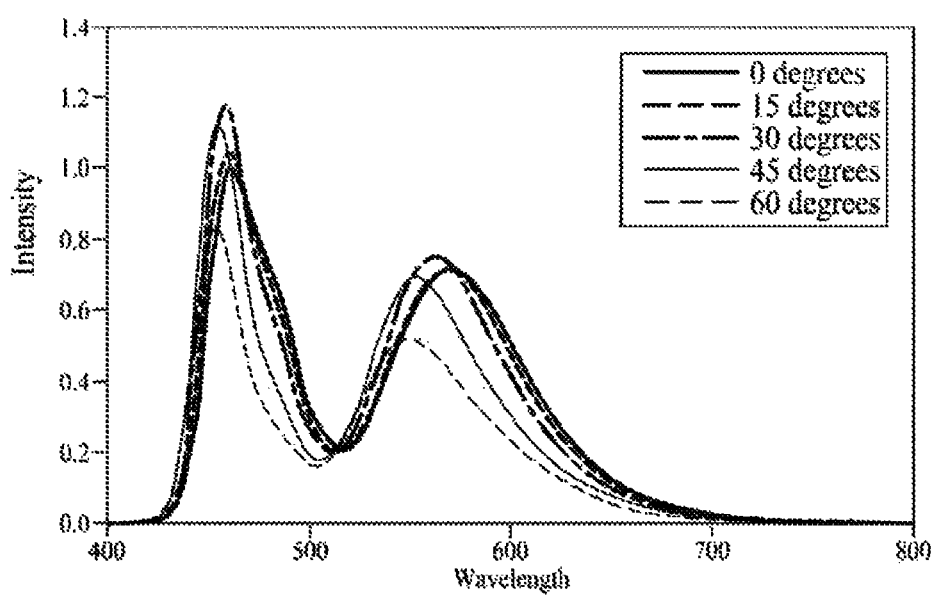
FIGS. 7A and 7B are diagrams showing EL spectrums based on a second thickness in an embodiment 2 of the present invention and a comparative example 3, respectively.
Figure 7B:
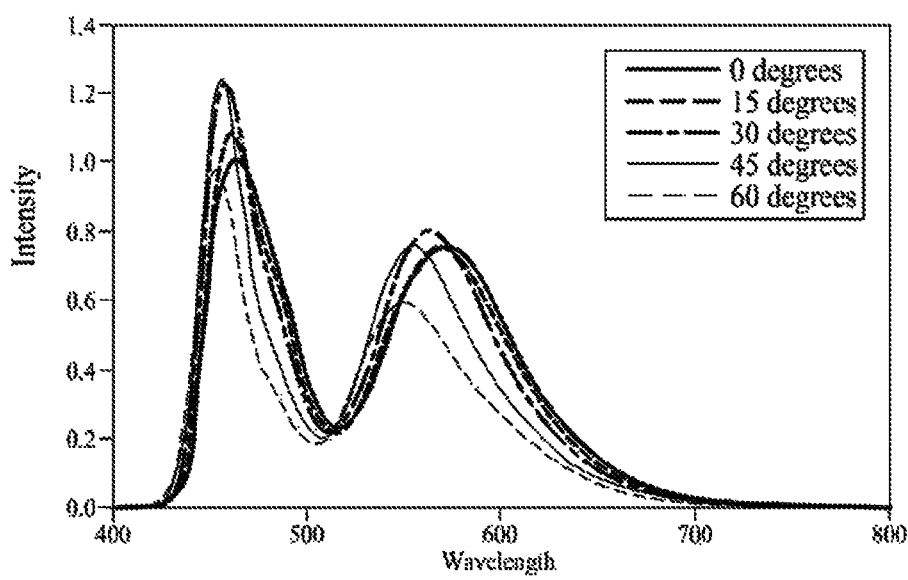

FIGS. 7A and 7B are diagrams showing EL spectrums based on a second thickness in an embodiment 2 of the present invention and a comparative example 3, respectively.

FIGS. 7A and 7B show results which are obtained by measuring an EL spectrum at 0 degrees, 15 degrees, 30 degrees, 45 degrees, and 60 degrees when seen from the front of an organic light emitting display device. Also, in FIGS. 7A and 7B, the abscissa axis indicates a wavelength range (nm) of light, and the ordinate axis indicates emission intensity (a.u., arbitrary unit). An emission intensity of blue corresponding to 0 degrees may be 1, and emission intensity may be expressed by converting emission intensity based on a wavelength range of light at various viewing angles. Here, the EL spectrum has been measured at 0 degrees, 15 degrees, 30 degrees, 45 degrees, and 60 degrees, but an angle at which the organic light emitting display device is seen may be changed depending on users. However, the angles for measurement do not limit details of the present invention.

FIG. 7A shows an EL spectrum of the embodiment 2 of the present invention depending on a viewing angle, and FIG. 7B shows an EL spectrum of the comparative example 3 depending on a viewing angle. In FIGS. 7A and 7B, a first peak wavelength "λmax" may be a peak wavelength corresponding to a blue area of a blue emission layer which is each of the first EML and the third EML illustrated in FIG. 1, and may be within a range of 440 nm to 480 nm. Also, a second peak wavelength "λmax" may be a peak wavelength corresponding to a yellow-green area of a yellow-green emission layer which is the second EML illustrated in FIG. 1, and may be within a range of 540 nm to 580 nm.

As shown in FIG. 7A, a first peak wavelength "λmax" of the embodiment 2 of the present invention has been measured as 460 nm at 0 degrees and measured as 452 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the embodiment 2 of the present invention has been measured as 568 nm at 0 degrees and measured as 548 nm at 60 degrees, and thus, it can be seen that a difference between the second peak wavelength "λmax" corresponding to 0 degrees and the second peak wavelength "λmax" corresponding to 60 degrees is 20 nm. To describe an emission intensity change rate of the embodiment 2, an emission intensity of blue may be 1.000 a.u. at 0 degrees and may be 0.832 a.u. at 60 degrees, and thus, it can be seen that the emission intensity change rate is 83.2%. Also, an emission intensity of yellow-green may be 0.716 a.u. at 0 degrees and may be 0.519 a.u. at 60 degrees, and thus, it can be seen that the emission intensity change rate is 72.5%.

As shown in FIG. 7B, a first peak wavelength "λmax" of the comparative example 3 has been measured as 464 nm at 0 degrees and measured as 456 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the comparative example 3 has been measured as 572 nm at 0 degrees and measured as 552 nm at 60 degrees, and thus, it can be seen that a difference between the second peak wavelength "λmax" corresponding to 0 degrees and the second peak wavelength "λmax" corresponding to 60 degrees is 20 nm. To describe an emission intensity change rate of the comparative example 3, an emission intensity of blue may be 1.000 a.u. at 0 degrees and may be 0.969 a.u. at 60 degrees, and thus, it can be seen that the emission intensity change rate is 96.9%. Also, an emission intensity of yellow-green may be 0.751 a.u. at 0 degrees and may be 0.589 a.u. at 60 degrees, and thus, it can be seen that the emission intensity change rate is 78.4%.

Color coordinates and a color change rate based on the second thickness T2 in FIGS. 7A and 7B will be described in detail with reference to FIGS. 8 and 9.

Figure 8:
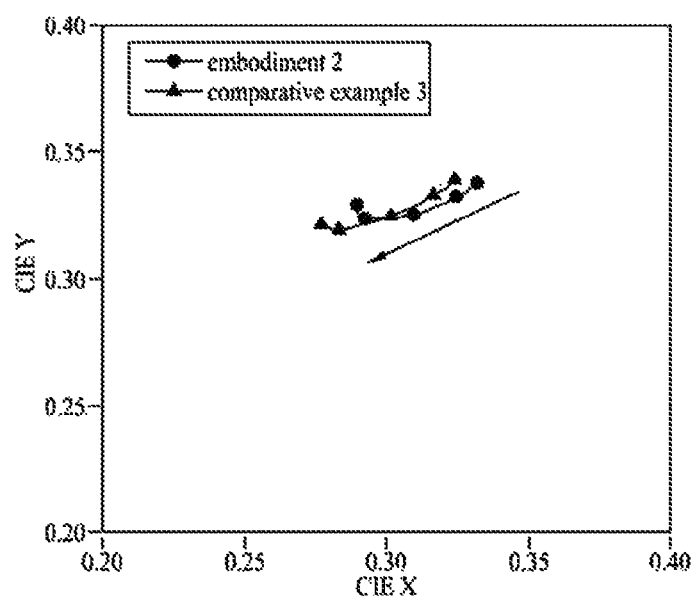
FIG. 8 is a diagram showing color coordinates with respect to viewing angles in the embodiment 2 of the present invention and the comparative example 3.

FIG. 8 is a diagram showing color coordinates with respect to viewing angles in the embodiment 2 of the present invention and the comparative example 3. In FIG. 9, color coordinates corresponding to 0 degrees, 15 degrees, 30 degrees, 45 degrees, and 60 degrees are illustrated as a connection line that connects the color coordinates, and color coordinates moved by 0 degrees, 15 degrees, 30 degrees, 45 degrees, and 60 degrees are illustrated as an arrow. The angles for measurement do not limit details of the present invention. The color coordinates have been measured from CIE 1931 color coordinates.

As the connection line illustrated in FIG. 8 becomes shorter, a change in color coordinates caused by a viewing angle is small. That is, in comparison with the comparative example 3, it can be seen that in the embodiment 2 of the present invention, a change in color coordinates caused by a viewing angle is small. Also, it can be seen that a color direction of the embodiment 2 of the present invention moves or shifts from a blue direction to a green direction.

Figure 9:
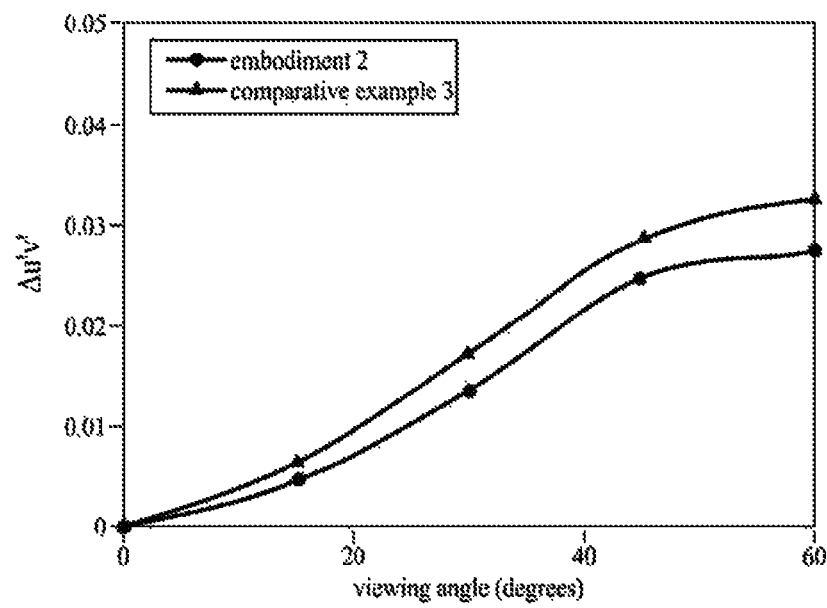
FIG. 9 is a diagram showing color change rates with respect to viewing angles in the embodiment 2 of the present invention and the comparative example 3.

FIG. 9 is a diagram showing color change rates "Δu'v'" with respect to viewing angles in the embodiment 2 of the present invention and the comparative example 3. In FIG. 9, the abscissa axis indicates a viewing angle, and the ordinate axis indicates a color change rate "Δu'v'".

FIG. 9 shows results which are obtained by measuring a color change rate "Δu'v'" at 0 degrees, 15 degrees, 30 degrees, 45 degrees, and 60 degrees when seen from the front of an organic light emitting display device. The color change rate "Δu'v'" has been measured based on CIE 1976 UCS diagram (u' v' coordinate system).

To describe a color change rate "Δu'v'" based on a viewing angle, as shown in FIG. 9, it can be seen that the color change rate "Δu'v'" of the embodiment 2 is 0.027 at 60 degrees, and the color change rate "Δu'v'" of the comparative example 3 is 0.032 at 60 degrees. It can be seen that the color change rate "Δu'v'" at 60 degrees of the embodiment 2 is small in comparison with the comparative example 3. Also, it can be seen that in the embodiment 2 and the comparative example 3, the color change rates "Δu'v'" at 45 degrees and 60 degrees are greater than 0.020.

As described above with reference to FIGS. 7A to 9, it can be seen that as the second thickness T2 increases, the second thickness T2 affects an emission intensity change rate of blue based on a viewing angle. Also, it can be seen that the second thickness T2 affects a color direction of color coordinates to be moved or shifted from a blue direction to a green direction.

FIGS. 10A to 12 show results which are obtained by adjusting the first thickness T1 of FIG. 1 to measure an EL spectrum, color coordinates, and a color change rate when a viewing angle is changed from 0 degrees to 60 degrees depending on the first thickness T1 in a state where the second thickness T2, the third thickness T3, and the fourth thickness T4 illustrated in FIG. 1 are not changed.

In FIGS. 10A to 12, the first thickness T1 may correspond to a thickness of at least one layer between the substrate 101 and the first EML 114. For example, the at least one layer in the first thickness T1 may include a first electrode 102 and a first HTL 112. A thickness of at least one layer in the first thickness T1 does not limit details of the present invention, and other layers may be further provided depending on a structure or characteristic of an organic light emitting device. For example, at least one of an HIL and an EBL which are between the substrate 101 and the first EML 114 may be further provided. In this case, the first thickness T1 may further include a thickness of an added layer.

Moreover, in an embodiment 3 shown in FIGS. 10A to 12, the first thickness T1 may be, for example, 220 nm. Measurement has been performed in a state where the third thickness T3 is 150 nm, the second thickness T2 is 45 nm, and the fourth thickness T4 is 25 nm. The first thickness T1, the second thickness T2, the third thickness T3, and the fourth thickness T4 may be values which are set for the experiment. In an embodiment 4, the first thickness T1 may be formed 52 nm thicker than 220 nm which is the first thickness T1 of the embodiment 3 of the present invention.

Figure 10A:
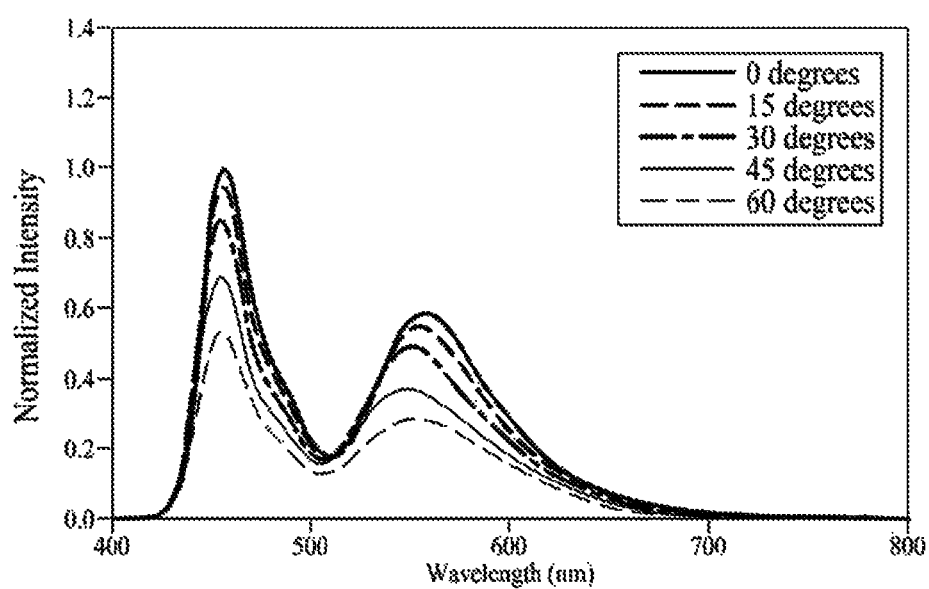
FIGS. 10A and 10B are diagrams showing EL spectrums based on a first thickness in an embodiment 3 and an embodiment 4 of the present invention, respectively.
Figure 10B:
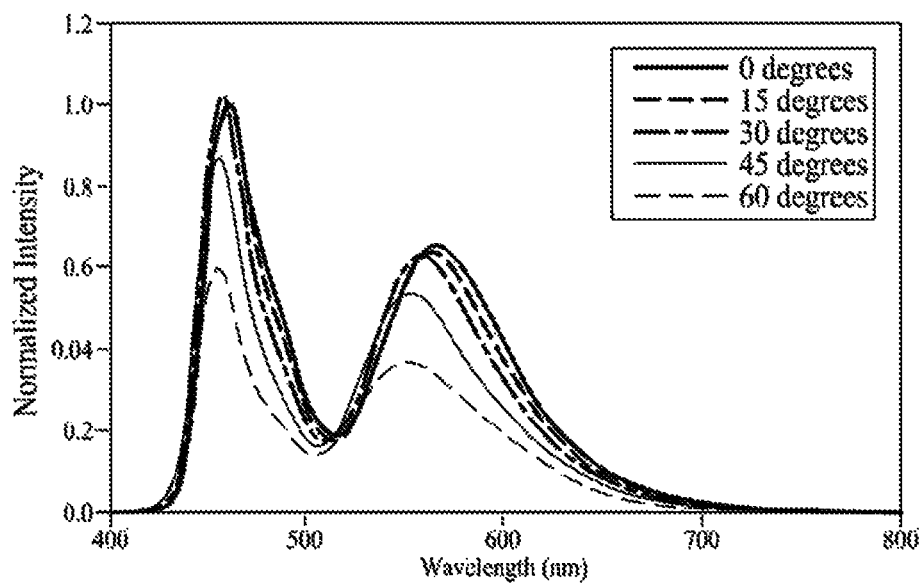

FIGS. 10A and 10B are diagrams showing EL spectrums based on a first thickness in an embodiment 3 and an embodiment 4 of the present invention, respectively.

FIGS. 10A and 10B show results which are obtained by measuring an EL spectrum at 0 degrees, 15 degrees, 30 degrees, 45 degrees, and 60 degrees when seen from the front of an organic light emitting display device. Also, in FIGS. 10A and 10B, the abscissa axis indicates a wavelength range (nm) of light, and the ordinate axis indicates emission intensity (a.u., arbitrary unit). An emission intensity of blue corresponding to 0 degrees may be 1, and emission intensity may be expressed by converting emission intensity based on a wavelength range of light at various viewing angles. Here, the EL spectrum has been measured at 0 degrees, 15 degrees, 30 degrees, 45 degrees, and 60 degrees, but an angle at which the organic light emitting display device is seen may be changed depending on users. However, the angles for measurement do not limit details of the present invention.

FIG. 10A shows an EL spectrum of the embodiment 3 of the present invention depending on a viewing angle, and FIG. 10B shows an EL spectrum of the embodiment 4 depending on a viewing angle. In FIGS. 10A and 10B, a first peak wavelength "λmax" may be a peak wavelength corresponding to a blue area of a blue emission layer which is each of the first EML and the third EML illustrated in FIG. 1, and may be within a range of 440 nm to 480 nm. Also, a second peak wavelength "λmax" may be a peak wavelength corresponding to a yellow-green area of a yellow-green emission layer which is the second EML illustrated in FIG. 1, and may be within a range of 540 nm to 580 nm.

As shown in FIG. 1 OA, a first peak wavelength "λmax" of the embodiment 3 of the present invention has been measured as 456 nm at 0 degrees and measured as 456 nm at 60 degrees, and thus, it can be seen that a difference between the first peak wavelength "λmax" corresponding to 0 degrees and the first peak wavelength "λmax" corresponding to 60 degrees is 0 nm. Also, a second peak wavelength "λmax" of the embodiment 3 of the present invention has been measured as 560 nm at 0 degrees and measured as 548 nm at 60 degrees, and thus, it can be seen that a difference between the second peak wavelength "λmax" corresponding to 0 degrees and the second peak wavelength "λmax" corresponding to 60 degrees is 12 nm. To describe an emission intensity change rate of the embodiment 3, an emission intensity of blue may be 1.000 a.u. at 0 degrees and may 0.485 a.u. at 60 degrees, and thus, it can be seen that the emission intensity change rate is 48.5%. Also, an emission intensity of yellow-green may 0.586 a.u. at 0 degrees and may 0.313 a.u. at 60 degrees, and thus, it can be seen that the emission intensity change rate is 53.4%.

As shown in FIG. 10B, a first peak wavelength "λmax" of the embodiment 4 has been measured as 460 nm at 0 degrees and measured as 452 nm at 60 degrees, and thus, it can be seen that a difference between the first peak wavelength "λmax" corresponding to 0 degrees and the first peak wavelength "λmax" corresponding to 60 degrees is 8 nm. Also, a second peak wavelength "λmax" of the embodiment 4 has been measured as 564 nm at 0 degrees and measured as 552 nm at 60 degrees, and thus, it can be seen that a difference between the second peak wavelength "λmax" corresponding to 0 degrees and the second peak wavelength "λmax" corresponding to 60 degrees is 12 nm. To describe an emission intensity change rate of the embodiment 4, an emission intensity of blue may be 1.000 a.u. at 0 degrees and may 0.589 a.u. at 60 degrees, and thus, it can be seen that the emission intensity change rate is 58.9%. Also, an emission intensity of yellow-green may 0.653 a.u. at 0 degrees and may 0.366 a.u. at 60 degrees, and thus, it can be seen that the emission intensity change rate is 56.1%.

Color coordinates and a color change rate based on the first thickness T1 in FIGS. 10A and 10B will be described in detail with reference to FIGS. 11 and 12.

Figure 11:
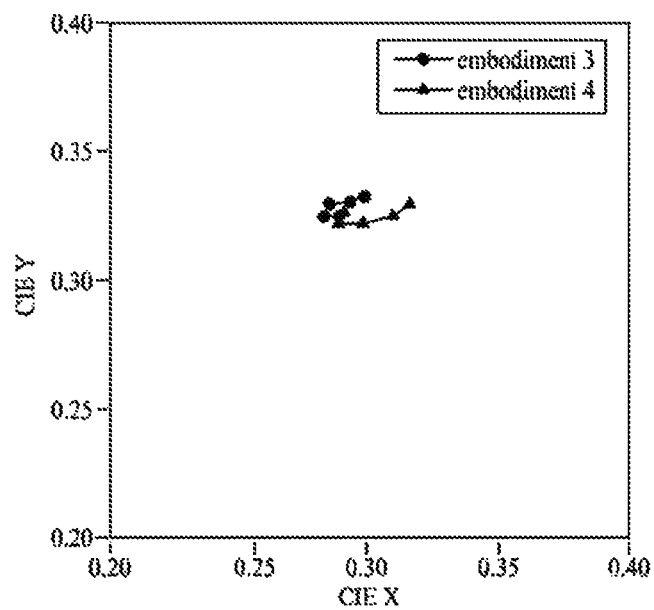
FIG. 11 is a diagram showing color coordinates with respect to viewing angles in the embodiment 3 and embodiment 4 of the present invention.

FIG. 11 is a diagram showing color coordinates with respect to viewing angles in the embodiment 3 and embodiment 4 of the present invention. In FIG. 11, color coordinates corresponding to 0 degrees, 15 degrees, 30 degrees, 45 degrees, and 60 degrees are illustrated as a connection line that connects the color coordinates, and color coordinates moved by 0 degrees, 15 degrees, 30 degrees, 45 degrees, and 60 degrees are illustrated as an arrow. The angles for measurement do not limit details of the present invention. The color coordinates have been measured from CIE 1931 color coordinates.

As the connection line illustrated in FIG. 11 becomes shorter, a change in color coordinates caused by a viewing angle is small. That is, it can be seen that in the embodiment 3 and embodiment 4 of the present invention, a change in color coordinates caused by a viewing angle is small. Also, it can be seen that a color direction of the embodiment 3 of the present invention moves or shifts from a blue direction to a red direction, and a color direction of the embodiment 4 moves or shifts from the blue direction to a green direction.

Figure 12:
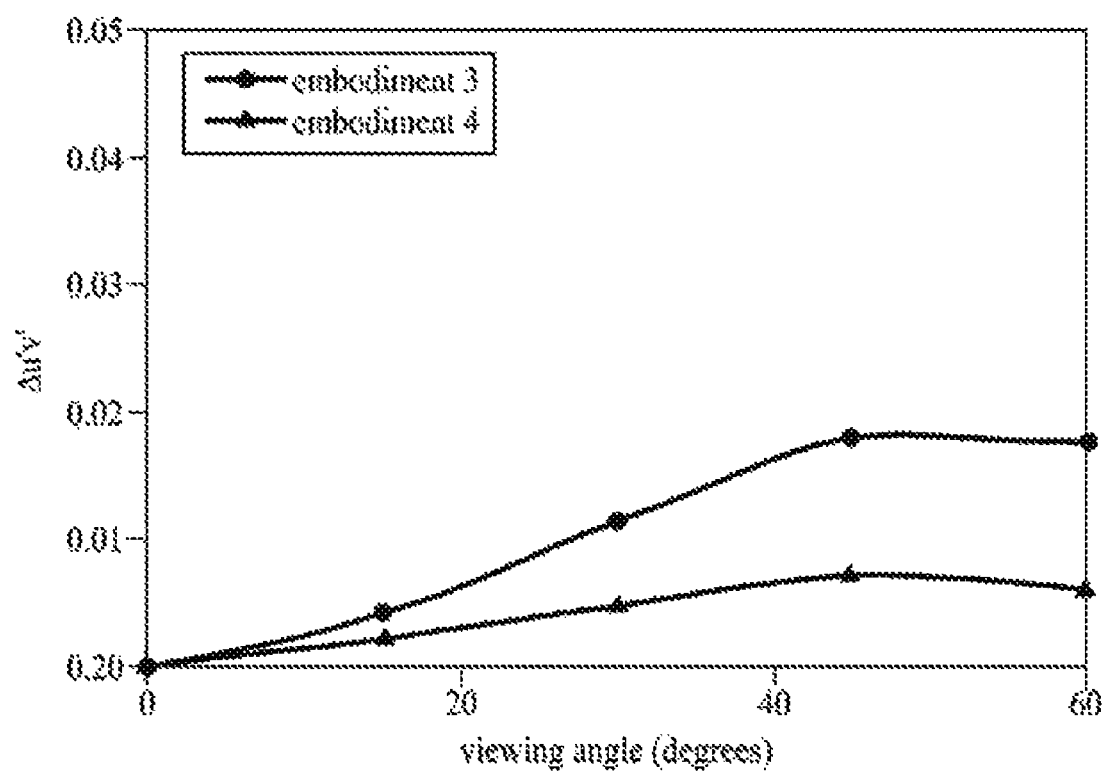
FIG. 12 is a diagram showing color change rates with respect to viewing angles in the embodiment 3 and embodiment 4 of the present invention.

FIG. 12 is a diagram showing color change rates "Δu'v'" with respect to viewing angles in the embodiment 3 and embodiment 4 of the present invention. In FIG. 12, the abscissa axis indicates a viewing angle, and the ordinate axis indicates a color change rate "Δu'v'".

FIG. 12 shows results which are obtained by measuring a color change rate "Δu'v'" at 0 degrees, 15 degrees, 30 degrees, 45 degrees, and 60 degrees when seen from the front of an organic light emitting display device. The color change rate "Δu'v'" has been measured based on CIE 1976 UCS diagram (u' v' coordinate system).

To describe a color change rate "Δu'v'" based on a viewing angle, as shown in FIG. 12, it can be seen that the color change rate "Δu'v'" of the embodiment 3 is 0.007 at 60 degrees, and the color change rate "Δu'v'" of the embodiment 4 is 0.018 at 60 degrees. It can be seen that the color change rate "Δu'v'" at 60 degrees of the embodiment 3 is small in comparison with the embodiment 4. Also, it can be seen that in the embodiment 3 and the embodiment 4, the color change rates "Δu'v'" at 0 degrees and 60 degrees are equal to or less than 0.020.

As described above with reference to FIGS. 10A to 12, it can be seen that as the first thickness T1 increases, the first thickness T1 affects a peak wavelength difference of blue based on a viewing angle, a peak wavelength difference of yellow-green based on a viewing angle, and an emission intensity change rate of blue based on a viewing angle. Also, it can be seen that the first thickness T1 affects a color direction of color coordinates to be moved or shifted from a blue direction to a green direction or a red direction.

As described above, it can be seen that the thicknesses of organic layers affect a peak wavelength difference of blue based on a viewing angle, a peak wavelength difference of yellow-green based on a viewing angle, an emission intensity change rate of blue based on a viewing angle, and an emission intensity change rate of yellow-green based on a viewing angle. Therefore, it can be seen that the thicknesses of the organic layers should be adjusted in consideration of a peak wavelength difference of blue based on a viewing angle, a peak wavelength difference of yellow-green based on a viewing angle, an emission intensity change rate of blue based on a viewing angle, and an emission intensity change rate of yellow-green based on a viewing angle.

Therefore, an organic light emitting device where the thicknesses of organic layers are adjusted based on the experiment results will be described with reference to FIG. 13.

Figure 13:
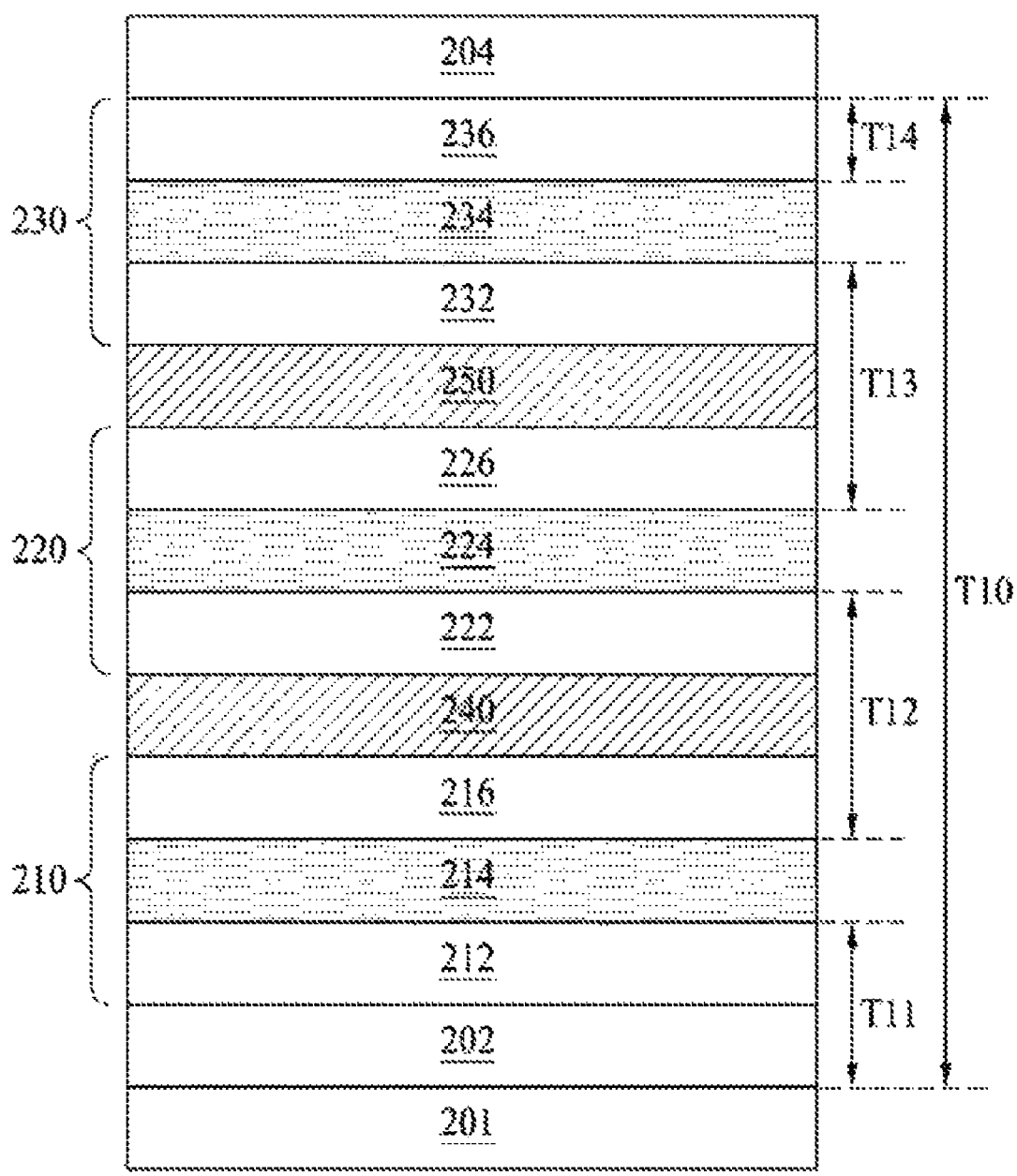
FIG. 13 is a schematic cross-sectional view illustrating an organic light emitting device according to another embodiment of the present invention.

FIG. 13 is a schematic cross-sectional view illustrating an organic light emitting device 200 according to another embodiment of the present invention.

The organic light emitting device 200 illustrated in FIG. 13 may include first and second electrodes 202 and 204 and first to third emission parts 210, 220 and 230 between the first and second electrodes 202 and 204, which are on a substrate 201. A first thickness T11 may refer to a first distance between the substrate 201 and a first emission layer 214 of the first emission part 210, i.e. between an upper surface of the substrate 201 and a lower surface of the first emission layer 214. Likewise, a second thickness T12 may refer to a second distance between the first emission layer 214 of the first emission part 210 and a second emission layer 224 of the second emission part 220, and a third thickness T13 may refer to a third distance between the second emission layer 224 of the second emission part 220 and a third emission layer 234 of the third emission part 230, and a fourth thickness T14 may refer to a fourth distance between the third emission layer 234 of the third emission part 230 and the second electrode 204.

The substrate 201 may be formed of an insulating material or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if an organic light emitting device which is easy to realize flexibility is applied to a lighting device for vehicles, various designs and a degree of freedom of design in a light device for vehicles are secured according to a structure or an appearance of a vehicle.

The first electrode 202 is an anode that supplies a hole, and may be formed of indium tin oxide (ITO) or indium zinc oxide (IZO) which is a transparent conductive material such as transparent conductive oxide (TCO). However, the present embodiment is not limited thereto.

The second electrode 204 is a cathode that supplies an electron, and may be formed of gold (Au), silver (Ag), aluminum (Al), molybdenum (Mo), or magnesium (Mg) which is a metal material, or may be formed of an alloy thereof. However, the present embodiment is not limited thereto.

Each of the first electrode 202 and the second electrode 204 may be referred to as an anode or a cathode. Also, the first electrode 202 may be referred to as a semi-transmissive electrode, and the second electrode 204 may be referred to as a reflective electrode. Alternatively, the first electrode 202 may be referred to as a reflective electrode, and the second electrode 204 may be referred to as a semi-transmissive electrode.

Here, a bottom emission type where the first electrode 202 is the semi-transmissive electrode and the second electrode 204 is the reflective electrode will be described.

The first emission part 210 may include a first HTL 212, a first EML 214, and a first ETL 216 which are on the first electrode 202.

An HIL may be further provided on the first electrode 202. The HIL enables a hole, supplied from the first electrode 202, to be smoothly injected. The HIL may be formed of two or more layers or two or more materials.

The first HTL 212 may supply a hole, supplied from the HIL, to the first EML 214. The first ETL 216 may supply an electron, supplied from the second electrode 204, to the first EML 214. Therefore, the hole supplied through the first HTL 212 and the electron supplied through the first ETL 216 may be recombined to generate an exciton in the first EML 214. An area (a zone) where the exciton is generated may be referred to as a recombination zone or an emission area (an emission zone).

The first HTL 212 may be formed of one or more layers or one or more materials. The first HTL 212 may be formed of one or more of N,N'-bis(naphthalene-1-yl)-N,N'-bis(phenyl)-2,2'-dimethylbenzidine (NPD), N,N'-bis-(3-methylphenyl)-N,N'-bis-(phenyl)-benzidine (TPD), 2,2',7,7'-tetrakis (N,N-diphenylamino)-9,9'-spirofluorene (s-TAD), and 4,4',4"-Tris(N-3-methylphenyl-N-phenyl-amino)-triphenylamine (MTDATA), but is not limited thereto.

The HIL may be formed of 4,4',4"-tris(3-methylphenylamino)triphenylamine (MTDATA), copper phthalocyanine (CuPc), poly(3,4-ethylenedioxythiophene, polystyrene sulfonate (PEDOT/PSS), and/or the like, but is not limited thereto.

The first ETL 216 may be formed of one or more layers or one or more materials. The first ETL 216 may be formed of one or more of 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), Bis(2-methyl-8-quinolinolate)-4-(phenylphenolato)aluminium (BAlq), 8-hydroxyquinolinolato-lithium (Liq), 2,2',2"-(1,3,5-benzinetriyl)-tris(1-phenyl-1-H-benzimidazole (TPBi), 5,5'-bis (dimethylboryl)-2,2':5',2"-terthiophene (BMB-3T), perfluoro-2-naphthyl-substituted (PF-6P), 2,2',2"-(1,3,5-benzinetriyl)-tris(1-phenyl-1-H-benzimidazole) (TPBi), and cyclooctatetracene (COT), but is not limited thereto. An EIL may be further formed on the first ETL 216. The EIL enables an electron, supplied from the second electrode 204, to be smoothly injected into the first ETL 216. The EIL may be formed of two or more layers or two or more materials.

An HBL may be further formed on the first EML 214. The HBL prevents a hole, injected into the first EML 214, from being transferred to the first ETL 216 and thus enhances a combination of an electron and a hole in the first EML 214, thereby enhancing an emission efficiency of the first EML 214. The first ETL 216 and the HBL may be provided as one layer.

An EBL may be further formed under the first EML 214. The EBL prevents an electron, injected into the first EML 214, from being transferred to the first HTL 212 and thus enhances a combination of an electron and a hole in the first EML 214, thereby enhancing an emission efficiency of the first EML 214. The first HTL 212 and the EBL may be provided as one layer.

The first EML 214 may be formed as one of a blue emission layer, a deep blue emission layer, and a sky blue emission layer. A peak wavelength "λmax" of light emitted from the first emission part 210 may be within a range from 440 nm to 480 nm.

A host of the first EML 214 may be formed of a single material or may be a mixed host including a mixed material. The mixed host may include a hole-type host and an electron-type host. For example, the host constituting the first EML 214 may be one among 4,4'bis(carbozol-9-yl) biphenyl (CBP), 1,3-bis(carbazol-9-yl)benzene (MCP), N,N'-bis(naphthalene-1-yl)-N,N'-bis(phenyl)-2,2'-dimethylbenzidine (NPD), 2,2',7,7'-tetrakis(2,2-diphenylvinyl)-spiro-9,9'-bifluorene(spiro-DPVBi), spirobifluorene (spino-6P), distyryl-benzene (DSB), distyryl arylene (DSA), polyfluorene (PFO)-based polymer, and polyphenylenevinylene (PPV)-based polymer or may be selected by mixing two or more materials thereof, but is not limited thereto.

Moreover, the dopant constituting the first EML 214 may include a pyrene-based material. In more detail, the dopant may include a pyrene-based compound substituted with an arylamine-based compound.

The first HTL 212, the first EML 214, the first ETL 216, the HIL, the EIL, a hole blocking layer (HBL), and an electron blocking layer (EBL) may each be referred to as an organic layer. Therefore, at least one organic layer may be formed between the substrate 201 and the first EML 214. That is, a first organic layer which is at least one organic layer may be formed between the substrate 201 and the first EML 214. The first organic layer may include at least one of the first HTL 212, the HIL, and the EBL.

The second emission part 220 may be on the first emission part 210 and may include a second HTL 222, a second EML 224, and a second ETL 226.

The second HTL 222 may be formed of the same material as that of the first HTL 212, but is not limited thereto. The second HTL 222 may be formed of two or more layers or two or more materials. Also, an HIL may be further formed under the second HTL 222. The HIL may be formed of two or more layers or two or more materials.

The second ETL 226 may be formed of the same material as that of the first ETL 116, but is not limited thereto. The second ETL 226 may be formed of two or more layers or two or more materials. Also, an EIL may be further formed under the second ETL 226. The EIL may be formed of two or more layers or two or more materials.

An EBL may be further formed under the second EML 224. Also, the second HTL 222 and the EBL may each be formed of one layer.

An HBL may be further formed under the second EML 224. Also, the second ETL 226 and the HBL may each be formed of one layer.

A hole supplied through the second HTL 222 and an electron supplied through the second ETL 226 may be recombined to generate an exciton in the second EML 224. An area (a zone) where the exciton is generated may be referred to as a recombination zone or an emission area (an emission zone).

The second EML 224 of the second emission part 220 may be formed as a yellow-green emission layer or a green emission layer. A peak wavelength of light emitted from the second emission part 220 may be within a range from 510 nm to 590 nm.

A host of the second EML 224 may include a single material or may be a mixed host having a mixed material. The mixed host may include a hole-type host and an electron-type host. For example, the host constituting the second EML 224 may be formed of one material of 4,4',4"-tris(carbazol-9-yl)triphenylamine (TCTA), 4,4'-bis(carbazol-9-yl)biphenyl (CBP), bis(2-methyl-8-quinolinolate)-(4-phenylphenolato)aluminum (BAlq), and polyphenylenevinylene (PPV), but is not limited thereto. A dopant constituting the second EML 224 may be formed of an iridium-based compound, but is not limited thereto.

Alternatively, the second EML 224 of the second emission part 220 may be formed of two layers of a yellow-green emission layer and a red emission layer. In this case, a peak wavelength "λmax" of light emitted from the second emission part 220 may be within a range from 510 nm to 650 nm. Alternatively, the second EML 224 may be formed of two layers of a yellow-green emission layer and a green emission layer. In this case, a peak wavelength "λmax" of the light emitted from the second emission part 220 may be within a range from 510 nm to 590 nm.

A first charge generation layer (CGL) 240 may be further formed between the first emission part 210 and the second emission part 220. The first CGL 240 may adjust a balance of electrical charges between the first emission part 210 and the second emission part 220. The first CGL 240 may include a first N-type CGL and a first P-type CGL. The first N-type CGL may inject an electron into the first emission part 210. The first P-type CGL may inject a hole into the second emission part 220.

The first N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The first P-type CGL may be formed as an organic layer including a P-type dopant, but is not limited thereto. Moreover, the first CGL 240 may be formed of a single layer.

The second HTL 222, the second EML 224, the second ETL 226, the second ETL 226, the first CGL 240, the HIL, the EIL, the HBL, and the EBL may each be referred to as an organic layer. Therefore, at least one organic layer may be formed between the first EML 214 and the second EML 224. That is, a second organic layer which is at least one organic layer may be formed between the first EML 214 and the second EML 224. The second organic layer may include at least one of the first ETL 216, the first CGL 240, the second HTL 222, the HIL, the EIL, the HBL, and the EBL.

The third emission part 230 may be on the second emission part 220 and may include a third HTL 232, a third EML 234, and a third ETL 236.

An HIL may be further formed under the third HTL 232. The HIL may be formed of two or more layers or two or more materials.

The third HTL 232 may be formed of N,N'-bis(naphthalene-1-yl)-N,N'-bis(phenyl)-2,2'-dimethylbenzidine (NPD), N,N'-bis(naphthalene-1-yl)-N,N'-bis(phenyl)-benzidine (NPB), and/or the like, but is not limited thereto. Also, the third HTL 232 may be formed of two or more layers or two or more materials.

An EIL may be further formed on the third ETL 236. The EIL may be formed of two or more layers or two or more materials.

The third ETL 236 may be formed of the same material as that of the first ETL 216, but is not limited thereto. The third ETL 236 may be formed of two or more layers or two or more materials.

An EBL may be further formed under the third EML 234. Also, the third HTL 232 and the EBL may each be formed of one layer.

An HBL may be further formed on the third EML 234. Also, the third ETL 236 and the HBL may each be formed of one layer.

A hole supplied through the third HTL 232 and an electron supplied through the third ETL 236 may be recombined to generate an exciton in the third EML 234. An area (a zone) where the exciton is generated may be referred to as a recombination zone or an emission area (an emission zone).

The third EML 234 of the third emission part 230 may be formed as one of a blue emission layer, a deep blue emission layer, and a sky blue emission layer. A peak wavelength of light emitted from the third emission part 230 may be within a range from 440 nm to 480 nm.

A host of the third EML 234 may be formed of a single material or may be a mixed host including a mixed material. The mixed host may include a hole-type host and an electron-type host. For example, the host constituting the third EML 234 may be one among 4,4'bis(carbozol-9-yl) biphenyl (CBP), 1,3-bis(carbazol-9-yl)benzene (MCP), N,N'-bis(naphthalene-1-yl)-N,N'-bis(phenyl)-2,2'-dimethyl-benzidine (NPD), 2,2',7,7'-tetrakis(2,2-diphenylvinyl)-spiro-9,9'-bifluorene(spiro-DPVBi), spirobifluorene (spino-6P), distyryl-benzene (DSB), distyryl arylene (DSA), polyfluorene (PFO)-based polymer, and polyphenylenevi-nylene (PPV)-based polymer or may be selected by mixing two or more materials thereof, but is not limited thereto.

Moreover, the dopant constituting the third EML 234 may include a pyrene-based material. In more detail, the dopant may include a pyrene-based compound substituted with an arylamine-based compound.

A second CGL 250 may be further formed between the second emission part 220 and the third emission part 230. The second CGL 250 may adjust a balance of electrical charges between the second emission part 220 and the third emission part 230. The second CGL 250 may include a second N-type CGL and a second P-type CGL.

The second N-type CGL may inject an electron into the second emission part 220. The second P-type CGL may inject a hole into the third emission part 230.

The second N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto.

The second P-type CGL may be formed as an organic layer including a P-type dopant, but is not limited thereto. The first CGL 240 may be formed of the same material as that of the second N-type CGL and second P-type CGL of the second CGL 250, but is not limited thereto. Also, the second CGL 250 may be formed of a single layer.

The third HTL 232, the third EML 234, the third ETL 236 the third CGL 250, the HIL, the EIL, the HBL, and the EBL may each be referred to as an organic layer. Therefore, a third organic layer which is at least one organic layer may be formed between the second EML 224 and the third EML 234. That is, a third organic layer which is at least one organic layer may be formed between the second EML 224 and the third EML 234. The third organic layer may include at least one of the second ETL 226, the second CGL 250, the third HTL 232, the HIL, the EIL, the HBL, and the EBL.

Moreover, at least one organic layer may be formed between the third EML 234 and the second electrode 204. That is, a fourth organic layer which is at least one organic layer may be formed between the third EML 234 and the second electrode 204. The fourth organic layer may include at least one of the third ETL 236, the EIL, and the HBL.

In FIG. 13, T11 to T14 may refer to the thicknesses of the first electrode 202 and at least one organic layer. A thickness T10 refers to a distance between the substrate 201 and the second electrode 204, namely, a total thickness of the first electrode 202 and a plurality of organic layers between the substrate 201 and the second electrode 204. As mentioned above, the first thickness T11 may refer to the first distance between the substrate 201 and the first emission layer (EML) 214 of the first emission part 210, i.e. between an upper surface of the substrate 201 and a lower surface of the first emission layer 214. Likewise, the second thickness T12 may refer to the second distance between the first emission layer 214 of the first emission part 210 and the second emission layer (EML) 224 of the second emission part 220, and the third thickness T13 may refer to the third distance between the second emission layer 224 of the second emission part 220 and the third emission layer (EML) 234 of the third emission part 230, and the fourth thickness T14 may refer to the fourth distance between the third emission layer 234 of the third emission part 230 and the second electrode 204. T10 may refer to a distance between the substrate 201 and the second electrode 204 i.e. between an upper surface of the substrate 201 and a lower surface of the second electrode 204.

As the third thickness T13 increases, the third thickness T13 may affect an emission intensity change rate of blue and an emission intensity change rate of yellow-green, and thus, an emission intensity change rate of blue and an emission intensity change rate of yellow-green should be adjusted for reducing a color change rate based on a viewing angle of an organic light emitting display device. That is, by adjusting the third thickness T13, an emission intensity change rate of blue may be adjusted to be changed similar to an emission intensity change rate of yellow-green. Here, an emission intensity change rate of blue being similar to an emission intensity change rate of yellow-green denotes that when an emission intensity change rate of yellow-green is a %, an emission intensity change rate of blue is within (a±15)%. For example, in FIG. 4A, an emission intensity change rate of yellow-green may be 58.7%, and an emission intensity change rate of blue may be 43.7% to 73.7% corresponding to a range similar thereto. In FIG. 4A, since an emission intensity change rate of blue is 70.4%, it can be seen that an emission intensity change rate of blue is similar to an emission intensity change rate of yellow-green. Therefore, an emission intensity change rate of blue and an emission intensity change rate of yellow-green can be adjusted to be similar to each other by adjusting the third thickness T13, and thus, a color change rate based on a viewing angle may be reduced. In contrast, in FIG. 4B, an emission intensity change rate of yellow-green may be 78.4%, and an emission intensity change rate of blue may be 63.4% to 93.4% corresponding to a range similar thereto. In FIG. 4B, since an emission intensity change rate of blue is 96.9%, it can be seen that an emission intensity change rate of blue is not similar to an emission intensity change rate of yellow-green. And, in FIG. 4C, an emission intensity change rate of yellow-green may be 88.9%, and an emission intensity change rate of blue may be 73.9% to 103.9% corresponding to a range similar thereto. In FIG. 4C, since an emission intensity change rate of blue is 123.0%, it can be seen that an emission intensity change rate of blue is not similar to an emission intensity change rate of yellow-green. Also, a peak wavelength difference of blue based on a viewing angle and a peak wavelength difference of yellow-green based on a viewing angle should be small for reducing a color change rate based on a viewing angle. Therefore, as the third thickness T13 increases, a color change rate based on a viewing angle and a peak wavelength difference of yellow-green based on a viewing angle may increase, and thus, as the third thickness T13 may be adjusted to be small, in particular, 150 nm or less. However, if the third thickness T13 is too small, emission efficiency is reduced.

Accordingly, the third thickness T13 may be adjusted to a range from 114 nm to 150 nm in consideration of a color change rate based on a viewing angle, an emission intensity change rate of blue based on a viewing angle, an emission intensity change rate of yellow-green based on a viewing angle, a peak wavelength difference of yellow-green based on a viewing angle, a peak wavelength difference of blue based on a viewing angle, and emission efficiency. Since the third thickness T13 is adjusted to the range, emission positions of the second EML 224 and the third EML 234 affected by the third thickness T13 may be adjusted, thereby providing an organic light emitting display device in which emission efficiency is enhanced and a color change rate based on a viewing angle is reduced.

Moreover, as the second thickness T12 increases, the second thickness T12 may affect an emission intensity change rate of blue and an emission intensity change rate of yellow-green, and thus, an emission intensity change rate of blue and an emission intensity change rate of yellow-green should be adjusted for reducing a color change rate based on a viewing angle of an organic light emitting display device. That is, an emission intensity change rate of blue may be adjusted to be changed similar to an emission intensity change rate of yellow-green. Here, an emission intensity change rate of blue being similar to an emission intensity change rate of yellow-green denotes that when an emission intensity change rate of yellow-green is a %, an emission intensity change rate of blue is within (a±15)%. For example, in FIG. 7A, an emission intensity change rate of yellow-green may be 72.5%, and an emission intensity change rate of blue may be 57.5% to 87.5% corresponding to a range similar thereto. In FIG. 7A, since an emission intensity change rate of blue is 83.2%, it can be seen that an emission intensity change rate of blue is similar to an emission intensity change rate of yellow-green. Therefore, an emission intensity change rate of blue and an emission intensity change rate of yellow-green can be adjusted to be similar to each other by adjusting the second thickness T12, and thus, a color change rate based on a viewing angle may be reduced. In contrast, in FIG. 7B, an emission intensity change rate of yellow-green may be 78.4%, and an emission intensity change rate of blue may be 63.4% to 93.4% corresponding to a range similar thereto. In FIG. 7B, since an emission intensity change rate of blue is 96.9%, it can be seen that an emission intensity change rate of blue is not similar to an emission intensity change rate of yellow-green. Also, it can be seen that a peak wavelength difference of blue based on a viewing angle and a peak wavelength difference of yellow-green based on a viewing angle affect a color change rate based on a viewing angle. That is, it can be seen that when a peak wavelength difference of blue based on a viewing angle and a peak wavelength difference of yellow-green based on a viewing angle are reduced, a color change rate based on a viewing angle is reduced. Also, as the second thickness T12 increases, a color change rate based on a viewing angle and a peak wavelength difference of blue based on a viewing angle may increase, and thus, as the second thickness T12 may be adjusted to be small, in particular, 50 nm or less. However, if the second thickness T12 is too small, emission efficiency is reduced. Accordingly, the second thickness T12 may be adjusted to a range from 25 nm to 50 nm in consideration of a color change rate based on a viewing angle, an emission intensity change rate of blue based on a viewing angle, a peak wavelength difference of blue based on a viewing angle, a peak wavelength difference of yellow-green based on a viewing angle, and emission efficiency. Since the second thickness T12 is adjusted to the range, an emission position of the first EML 214 affected by the second thickness T12 may be adjusted, thereby providing an organic light emitting display device in which emission efficiency is enhanced and a color change rate based on a viewing angle is reduced. Also, since the second thickness T12 is adjusted to the range, a color direction of color coordinates may move or shift from a blue direction to a direction insensitive to a color change, thereby providing an organic light emitting display device in which a color defect where a color of a screen is changed to a bluish color is reduced.

Moreover, as the first thickness T11 increases, the first thickness T11 may affect a peak wavelength difference of blue and a peak wavelength difference of yellow-green, and thus, it can be seen that a peak wavelength difference of blue and a peak wavelength difference of yellow-green should be reduced for reducing a color change rate of an organic light emitting display device. Also, the first thickness T11 may affect an operation of adjusting an emission intensity change rate of blue and an emission intensity change rate of yellow-green to be similar to each other. Here, an emission intensity change rate of blue being similar to an emission intensity change rate of yellow-green denotes that when an emission intensity change rate of yellow-green is a %, an emission intensity change rate of blue is (a±15)%. For example, in FIG. 10A, an emission intensity change rate of yellow-green may be 53.4%, and an emission intensity change rate of blue may be 38.4% to 68.4% corresponding to a range similar thereto. In FIG. 10A, an emission intensity change rate of blue may be 48.5%, and thus, it can be seen that an emission intensity change rate of blue is similar to an emission intensity change rate of yellow-green. In FIG. 10B, an emission intensity change rate of yellow-green may be 56.1%, and an emission intensity change rate of blue may be 41.1% to 81.1% corresponding to a range similar thereto. In FIG. 10B, an emission intensity change rate of blue may be 58.9%, and thus, it can be seen that an emission intensity change rate of blue is similar to an emission intensity change rate of yellow-green. Therefore, since an emission intensity change rate of blue and an emission intensity change rate of yellow-green are adjusted to be similar to each other by adjusting the first thickness T11, a color change rate based on a viewing angle is reduced. Also, it can be seen that in comparison with the embodiment 1 and the embodiment 2, a peak wavelength difference of yellow-green based on a viewing angle is reduced by adjusting the first thickness T11. Therefore, it can be seen that when a peak wavelength difference of blue based on a viewing angle and a peak wavelength difference of yellow-green based on a viewing angle are reduced, a color change rate based on a viewing angle is reduced. As a result, it can be seen that a peak wavelength difference of yellow-green based on a viewing angle should be adjusted to 12 nm or less. Also, it can be seen that a peak wavelength difference of blue based on a viewing angle should be adjusted to 8 nm or less. Therefore, since a color change rate based on a viewing angle, a peak wavelength difference of blue based on a viewing angle, and a peak wavelength difference of yellow-green based on a viewing angle are reduced depending on the first thickness T11, the first thickness T11 may be adjusted to 240 nm or less. However, if the first thickness T11 is too large, emission efficiency is reduced. Accordingly, the first thickness T11 may be adjusted to a range from 165 nm to 240 nm in consideration of a color change rate based on a viewing angle, an emission intensity change rate of blue based on a viewing angle, a peak wavelength difference of blue based on a viewing angle, a peak wavelength difference of yellow-green based on a viewing angle, and emission efficiency. Since the first thickness T11 is adjusted to the range, a color direction of color coordinates may move or shift from a blue direction to a red direction, and thus may move or shift the blue direction to a direction insensitive to a color change, thereby providing an organic light emitting display device in which a color defect where a color of a screen is changed to a bluish color is reduced. Also, a fourth thickness T14 may be adjusted to 35 nm or less.

As described above, the first to fourth thicknesses T11 to T14 may be adjusted in consideration of a peak wavelength difference of blue based on a viewing angle, a peak wavelength difference of yellow-green based on a viewing angle, an emission intensity change rate of blue based on a viewing angle, and an emission intensity change rate of yellow-green based on a viewing angle, thereby providing an organic light emitting display device in which a color change rate "Δu'v'" based on a viewing angle is reduced. That is, provided is an organic light emitting display device in which a color change rate "Δu'v'" is 0.020 or less at 0 degrees to 60 degrees thereof. Accordingly, provided is an organic light emitting display device in which a color defect where a color of a screen is changed to a bluish color is reduced.

Moreover, in order to reduce a color change rate "Δu'v'" based on a viewing angle, the first to fourth thicknesses T11 to T14 may each be adjusted in consideration of a peak wavelength difference of blue based on a viewing angle, a peak wavelength difference of yellow-green based on a viewing angle, an emission intensity change rate of blue based on a viewing angle, and an emission intensity change rate of yellow-green based on a viewing angle. Therefore, the first to fourth thicknesses T11 to T14 may be differently configured. That is, the first thickness T11 may be larger than the second thickness T12 or the third thickness T13, and thus, a peak wavelength difference of blue based on a viewing angle is reduced, and an emission intensity change rate of blue based on a viewing angle may be adjusted similar to an emission intensity change rate of yellow-green based on a viewing angle, thereby reducing a color change rate "Δu'v'" based on a viewing angle. Also, the second thickness T12 may be smaller than the third thickness T13, and thus, an emission intensity change rate of blue based on a viewing angle is reduced, and an emission intensity change rate of blue based on a viewing angle may be adjusted similar to an emission intensity change rate of yellow-green based on a viewing angle, thereby reducing a color change rate "Δu'v'" based on a viewing angle. Also, the fourth thickness T14 may be smaller than the third thickness T13, and thus, a peak wavelength difference of blue based on a viewing angle is reduced, thereby reducing a color change rate "Δu'v'" based on a viewing angle.

Moreover, the third thickness T13 may include a thickness of at least one third organic layer between the second EML 224 and the third EML 234. The at least one third organic layer may include at least one of the second ETL 226, the second CGL 250, the third HTL 232, the HIL, the EIL, the HBL, and the EBL. Also, at least one of the second ETL 226, the third HTL 232, the HIL, and the EIL may be formed of two or more layers.

Moreover, the second thickness T12 may include a thickness of at least one second organic layer between the first EML 214 and the second EML 224. The at least one second organic layer may include at least one of the first ETL 216, the first CGL 240, the second HTL 222, the HIL, the EIL, the HBL, and the EBL. Also, at least one of the first ETL 216, the second HTL 222, the HIL, and the EIL may be formed of two or more layers.

Moreover, the first thickness T11 may include a thickness of at least one first organic layer between the substrate 201 and the first EML 214 and a thickness of the first electrode 202. The at least one first organic layer may include at least one of the first HTL 212, the HIL, and the EBL. Also, at least one of the first HTL 212 and the HIL may be formed of two or more layers.

Moreover, the fourth thickness T14 may be a thickness between the third EML 234 and the second electrode 204. The fourth thickness T14 may include a thickness of at least one fourth organic layer between the third EML 234 and the second electrode 204. The at least one fourth organic layer may include at least one of the third ETL 236, the EIL, and the HBL. Also, at least one of the third ETL 236 and the EIL may be formed of two or more layers. Also, the fourth thickness T14 may affect a color change rate "Δu'v'" based on a viewing angle to be reduced, by reducing a peak wavelength difference of blue based on a viewing angle. Accordingly, the fourth thickness T14 may be configured irrespective of a structure or characteristic of an organic light emitting device, but may be preferably configured to reduce a color change rate "Δu'v'" based on a viewing angle.

Moreover, a total thickness T10 may be a thickness from a bottom surface of the second electrode 204 to a top surface of the substrate 201. That is, the total thickness T10 may include a thickness of the first emission part 210, the second emission part 220, the third emission part 230, the first CGL 240, the second CGL 250, and the first electrode 202. Also, the total thickness T10 may be adjusted to a range from 334 nm to 580 nm. The total thickness T10 is a thickness which includes a thickness of the first EML 214, a thickness of the second EML 224, and a thickness of the third EML 234. A thickness of the first EML 214 and a thickness of the third EML 234 may each be within a range from 10 nm to 40 nm. Also, a thickness of the second EML 224 may be within a range from 10 nm to 60 nm. Therefore, a sum of a thickness of the first EML 214, a thickness of the second EML 224, and a thickness of the third EML 234 may be within a range from 30 nm to 140 nm.

Moreover, according to the embodiments of the present invention, the first emission part 210, the second emission part 220, and the third emission part 230 may include an adjusted thickness of organic layers (ATOL) structure so that a thickness of at least one organic layer is adjusted to reduce a color change rate "Δu'v'" based on a viewing angle by decreasing a change in color coordinates based on a viewing angle, considering a peak wavelength difference based on a viewing angle and an emission intensity change rate based on a viewing angle.

The first EML and the third EML may each include one of a blue emission layer, a sky blue emission layer, and a deep blue emission layer, and the second EML may include one of a yellow-green emission layer and a green emission layer.

The ATOL structure is characterized in that a peak wavelength difference based on a viewing angle of each of the first EML and the third EML is less than 8 nm, and a peak wavelength difference based on a viewing angle of the second EML is 12 nm or less. Also, the ATOL structure is characterized in that when an emission intensity change rate based on a viewing angle of the second EML is a %, an emission intensity change rate based on a viewing angle of each of the first EML and the third EML is within (a±15)%.

Therefore, according to the ATOL structure, since color change rates "Δu'v'" at 0 degrees to 60 degrees with respect to an organic light emitting display device are 0.020 or less, a color defect caused by a color change based on a viewing angle of the organic light emitting display device is reduced. That is, since the color change rates "Δu'v'" at 0 degrees to 60 degrees are 0.020 or less, sharper image quality is provided, and an organic light emitting display device which provides realistic and sharp image quality through a large screen like televisions (TVs) is implemented. Also, the color change rates "Δu'v'" at 0 degrees to 60 degrees respectively denote color change rates "Δu'v'" at 0 degrees, 15 degrees, 30 degrees, 45 degrees, and 60 degrees.

The organic light emitting device according to another embodiment of the present invention has been described above as being applied to a bottom emission type display device, but is not limited thereto. In other embodiments, the organic light emitting device according to another embodiment of the present invention may be applied to a top emission type display device or a dual emission type display device.

The above-described organic light emitting device may be applied to lighting devices, may be used as a light source of an LCD device, and may be applied to display devices. An organic light emitting display device including the organic light emitting device according to another embodiment of the present invention may be a white organic light emitting display device that emits white light by using a first emission part including a first EML, a second emission part including a second EML, and a third emission part including a third EML. Therefore, when the organic light emitting device according to another embodiment of the present invention is applied to an organic light emitting display device, the organic light emitting display device may be implemented as a white organic light emitting display device including four pixels (for example, a white pixel, a red pixel, a green pixel, and a blue pixel). Also, an organic light emitting display device including the organic light emitting device according to another embodiment of the present invention may be applied to a bottom emission display device, a top emission display device, a dual emission display device, a lighting device for vehicles, and/or the like. The lighting device for vehicles may be at least one of headlights, a high beam, taillights, a brake light, a back-up light, a fog lamp, a turn signal light, and an auxiliary lamp, but is not limited thereto. Alternatively, the organic light emitting display device including the organic light emitting device according to another embodiment of the present invention may be applied to all indicator lamps which are used to secure a field of view of a driver and transmit or receive a signal of a vehicle. Also, the organic light emitting display device including the organic light emitting device according to another embodiment of the present invention may be applied to mobile equipment, monitors, televisions (TVs), and/or the like. In the organic light emitting display device including the organic light emitting device according to another embodiment of the present invention, a pixel area may be defined by a gate line and a data line on a substrate 201. A power line which extends in parallel with one of the gate line and the data line may be on the substrate 201, and a switching thin film transistor (TFT) connected to the gate line or the data line and a driving TFT connected to the switching TFT may be in the pixel area. The driving TFT may be connected to the first electrode 202.

Hereinafter, an embodiment where the organic light emitting device according to another embodiment of the present invention is applied to a display device will be described.

Figure 14:
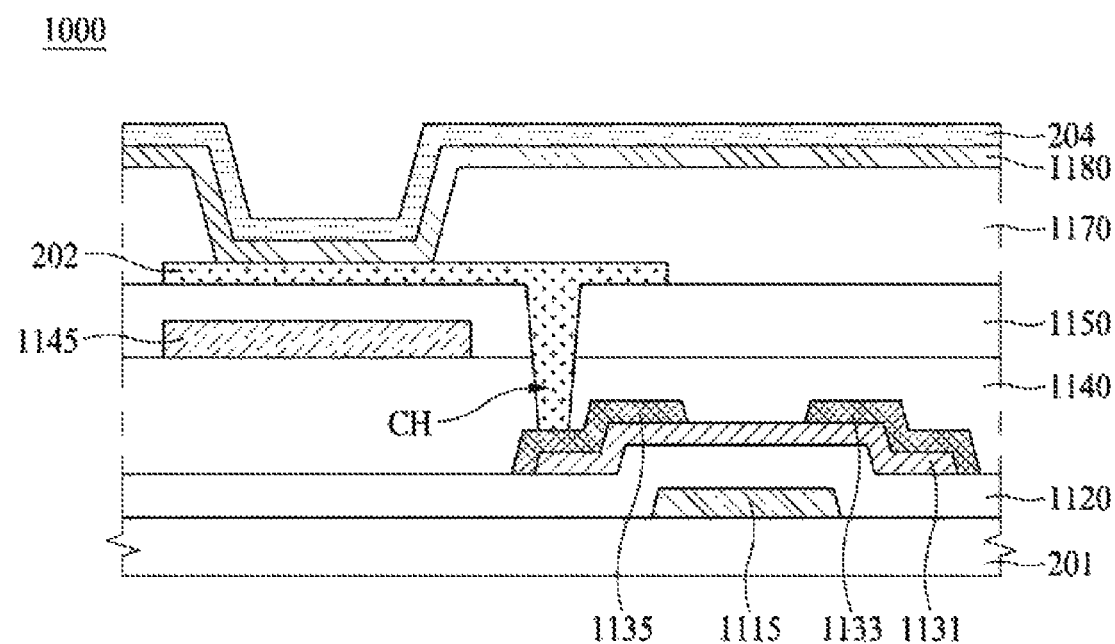
FIG. 14 is a schematic cross-sectional view illustrating an organic light emitting display device according to another embodiment of the present invention.

FIG. 14 is a schematic cross-sectional view illustrating an organic light emitting display device 1000 including an organic light emitting device according to another embodiment of the present invention, and uses the above-described organic light emitting device illustrated in FIG. 13.

As illustrated in FIG. 14, the organic light emitting display device 1000 according to another embodiment of the present invention includes a substrate 201, a thin film transistor TFT, an overcoating layer 1150, a first electrode 202, an emission part 1180, and a second electrode 204. The TFT includes a gate electrode 1115, a gate insulator 1120, a semiconductor layer 1131, a source electrode 1133, and a drain electrode 1135.

In FIG. 14, the thin film transistor TFT is illustrated as having an inverted staggered structure, but may be formed in a coplanar structure.

The substrate 201 may be formed of an insulating material or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if an organic light emitting device which is easy to realize flexibility is applied to a lighting device for vehicles, various designs and a degree of freedom of design in a light device for vehicles are secured according to a structure or an appearance of a vehicle.

The gate electrode 1115 may be formed on the substrate 201 and may be connected to a gate line. The gate electrode 1115 may include a multilayer formed of one of molybdenum (Mo), aluminum (Al), chromium (Cr), gold (Au), titanium (Ti), nickel (Ni), neodymium (Nd), and copper (Cu) or an alloy thereof.

The gate insulator 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulator 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

The overcoating layer 1150 may be formed on the color filter 1145 and may be formed of an acryl resin, a polyimide resin, SiOx, SiNx, or a multilayer thereof, but is not limited thereto.

The first electrode 202 may be formed on the overcoating layer 1150. The first electrode 202 is an anode that supplies a hole, and may be formed of indium tin oxide (ITO) or indium zinc oxide (IZO) which is a transparent conductive material such as transparent conductive oxide (TCO). However, the present embodiment is not limited thereto. The first electrode 202 may be electrically connected to the drain electrode 1135 through a contact hole CH which is formed in a certain area of the passivation layer 1140 and the overcoating layer 1150. In FIG. 14, the drain electrode 1135 is illustrated as being electrically connected to the first electrode 202, but the present embodiment is not limited thereto. As another example, the source electrode 1133 may be electrically connected to the first electrode 202 through the contact hole CH which is formed in the certain area of the passivation layer 1140 and the overcoating layer 1150.

A bank layer 1170 may be formed on the first electrode 202 and may define a pixel area. That is, the bank layer 1170 may be formed in a boundary area between a plurality of pixels, and thus, the pixel area may be defined by the bank layer 1170. The bank layer 1170 may be formed of an organic material such as a benzocyclobutene (BCB) resin, an acryl resin, or a polyimide resin. Alternatively, the bank layer 1170 may be formed of a photosensitive material containing a black pigment, and in this case, the bank layer 1170 may act as a light blocking member.

The emission part 1180 may be formed on the bank layer 1170. As illustrated in FIG. 13, the emission part 1180 may include a first emission part 210, a second emission part 220, and a third emission part 230 which are formed on the first electrode 202.

The second electrode 204 may be formed on the emission part 1180. The second electrode 204 may be formed of gold (Au), silver (Ag), aluminum (Al), molybdenum (Mo), or magnesium (Mg) which is a metal material, or may be formed of an alloy thereof, but is not limited thereto.

An encapsulation part may be formed on the second electrode 204. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

As described above, according to the embodiments of the present invention, since the thicknesses of organic layers configuring emission parts are differently adjusted in consideration of a peak wavelength difference based on a viewing angle and an emission intensity change rate based on a viewing angle, a color change rate "Δu'v'" based on a viewing angle is reduced.

Moreover, since the thicknesses of organic layers configuring emission parts are optimized, color change rates "Δu'v'" at 0 degrees to 60 degrees are adjusted to a range of 0.020 or less, a color defect caused by a color change based on a viewing angle of an organic light emitting display device is reduced.

Moreover, since the thicknesses of organic layers configuring emission parts are optimized, color change rates "Δu'v'" at to 0 degrees to 60 degrees are adjusted to a range of 0.020 or less, and a color direction moves or shifts from a blue direction to a direction insensitive to a color change. Accordingly, a color defect where a color of a screen of an organic light emitting display device is changed to a bluish color is reduced.

Moreover, by applying the ATOL structure where the thicknesses of organic layers configuring three or more emission parts differ, a color change rate "Δu'v'" based on a viewing angle is reduced.

Moreover, by applying the ATOL structure where the thicknesses of organic layers configuring three or more emission parts differ, a peak wavelength difference based on a viewing angle is minimized, and thus, a color change rate "Δu'v'" based on a viewing angle is reduced, thereby reducing a color defect caused by a color change based on a viewing angle of an organic light emitting display device.

Moreover, by applying the ATOL structure where the thicknesses of organic layers configuring three or more emission parts differ, an emission intensity change rate based on a viewing angle is minimized, and thus, a color change rate "Δu'v'" based on a viewing angle is reduced, thereby reducing a color defect caused by a color change based on a viewing angle of an organic light emitting display device.

The details of the embodiments of the present invention described in technical problem, technical solution, and advantageous effects do not specify essential features of claims, and thus, the scope of claims is not limited by the details described in detailed description of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a first electrode on a substrate;
a first emission part on the first electrode, the first emission part including a first emission layer;
a second emission part on the first emission part, the second emission part including a second emission layer;
a third emission part on the second emission part, the third emission part including a third emission layer; and
a second electrode on the third emission part,
wherein a first distance between the substrate and the first emission layer, a second distance between the first emission layer and the second emission layer, a third distance between the second emission layer and the third emission layer, and a fourth distance between the third emission layer and the second electrode are different from each other.

2. The organic light emitting display device of claim 1, wherein the first distance is larger than the second distance or the third distance.

3. The organic light emitting display device of claim 1, wherein the second distance is smaller than the third distance.

4. The organic light emitting display device of claim 1, wherein the fourth distance is smaller than the third distance.

5. The organic light emitting display device of claim 1, wherein
the first distance comprises a thickness of at least one first layer between the substrate and the first emission layer and a thickness of the first electrode, and the first distance is within a range from approximately 165 nm to 240 nm.

6. The organic light emitting display device of claim 1, wherein
the second distance comprises a thickness of at least one second layer between the first emission layer and the second emission layer, and
the second distance is within a range from approximately 25 nm to 50 nm.

7. The organic light emitting display device of claim 1, wherein
the third distance comprises a thickness of at least one third layer between the second emission layer and the third emission layer, and
the third distance is within a range from approximately 114 nm to 150 nm.

8. The organic light emitting display device of claim 1, wherein
the fourth distance comprises a thickness of at least one fourth organic layer between the third emission layer and the second electrode, and
the fourth distance is within a range of approximately 35 nm or less.

9. The organic light emitting display device of claim 1, wherein a distance from a bottom surface of the second electrode to a top surface of the substrate is within a range from approximately 334 nm to 580 nm.

10. The organic light emitting display device of claim 1, wherein a sum of a thickness of the first emission layer, a thickness of the second emission layer, and a thickness of the third emission layer is within a range from approximately 30 nm to 140 nm.

11. The organic light emitting display device of claim 1, wherein the first distance, the second distance, the third distance, and the fourth distance are adjusted to reduce a color change rate based on a viewing angle, based on a peak wavelength difference and an emission intensity change rate based on a viewing angle of each of the first to third emission layers.

12. The organic light emitting display device of claim 11, wherein
the first emission layer and the third emission layer each comprise one of a blue emission layer, a sky blue emission layer, and a deep blue emission layer, and
the second emission layer comprises one of a yellow-green emission layer and a green emission layer.

13. The organic light emitting display device of claim 12, wherein
the peak wavelength difference based on a viewing angle of each of the first emission layer and the third emission layer is 8 nm or less, and
the peak wavelength difference based on a viewing angle of the second emission layer is 12 nm or less.

14. The organic light emitting display device of claim 11, wherein the emission intensity change rate based on a viewing angle of each of the first emission layer and the third emission layer is within (a±15)%, with a % being an emission intensity change rate based on a viewing angle of the second emission layer.

15. The organic light emitting display device of claim 11, wherein color change rates of the organic light emitting display device at viewing angles of 0 degrees to 60 degrees are 0.020 or less.

16. An organic light emitting display device comprising:
a first electrode and a second electrode on a substrate, the first electrode being opposite to the second electrode; and
at least three emission parts between the first electrode and the second electrode, the at least three emission parts including at least one organic layer,
wherein the at least three emission parts comprise a first emission part including a first emission layer, a second emission part including a second emission layer, and a third emission part including a third emission layer, and
wherein the at least three emission parts comprise an adjusted thickness of organic layers (ATOL) structure so that a thickness of the at least one organic layer is adjusted to reduce a color change rate based on a viewing angle, based on a peak wavelength difference and an emission intensity change rate based on a viewing angle.

17. The organic light emitting display device of claim 16, wherein
the first emission layer and the third emission layer each comprise one of a blue emission layer, a sky blue emission layer, and a deep blue emission layer, and
the second emission layer comprises one of a yellow-green emission layer and a green emission layer.

18. The organic light emitting display device of claim 16, wherein the ATOL structure is configured so that the peak wavelength difference based on a viewing angle of each of the first emission layer and the third emission layer is 8 nm or less, and the peak wavelength difference based on a viewing angle of the second emission layer is 12 nm or less.

19. The organic light emitting display device of claim 16, wherein the ATOL structure is configured so that the emission intensity change rate based on a viewing angle of each of the first emission layer and the third emission layer is within (a±15)%, with a % being an emission intensity change rate based on a viewing angle of the second emission layer.

20. The organic light emitting display device of claim 16, wherein the ATOL structure is configured so that color change rates at viewing angles of 0 degrees to 60 degrees are 0.020 or less.

21. The organic light emitting display device of claim 16, further comprising:
at least one first organic layer between the substrate and the first emission layer,
wherein a sum of a thickness of the at least one first organic layer and a thickness of the first electrode is within a range from approximately 165 nm to 240 nm.

22. The organic light emitting display device of claim 16, further comprising:
at least one second organic layer between the first emission layer and the second emission layer,
wherein a thickness of the at least one second organic layer is within a range from approximately 25 nm to 50 nm.

23. The organic light emitting display device of claim 16, further comprising:
at least one third organic layer between the second emission layer and the third emission layer,
wherein a thickness of the at least one third organic layer is within a range from approximately 114 nm to 150 nm.

24. The organic light emitting display device of claim 16, further comprising:
at least one fourth organic layer between the third emission layer and the second electrode,
wherein a thickness of the at least one fourth organic layer is within a range of approximately 35 nm or less.

25. The organic light emitting display device of claim 16, wherein a thickness from a bottom surface of the second electrode to a top surface of the substrate is within a range from approximately 334 nm to 580 nm.

26. The organic light emitting display device of claim 16, wherein a sum of a thickness of the first emission layer, a thickness of the second emission layer, and a thickness of the third emission layer is within a range from approximately 30 nm to 140 nm.

* * * * *